United States Patent
Yamauchi et al.

(10) Patent No.: US 8,922,259 B2
(45) Date of Patent: Dec. 30, 2014

(54) GATE DRIVE CIRCUIT

(71) Applicant: Denso Corporation, Kariya, Aichi-pref. (JP)

(72) Inventors: Kazuki Yamauchi, Chiryu (JP); Yasutaka Senda, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/200,367

(22) Filed: Mar. 7, 2014

(65) Prior Publication Data
US 2014/0253184 A1 Sep. 11, 2014

(30) Foreign Application Priority Data

Mar. 11, 2013 (JP) .................................. 2013-47951

(51) Int. Cl.
*H03K 3/00* (2006.01)
*H03K 17/56* (2006.01)

(52) U.S. Cl.
CPC ..................................... *H03K 17/56* (2013.01)
USPC ............................ 327/109; 327/108; 327/412

(58) Field of Classification Search
USPC .......... 327/108, 109, 112, 398, 407, 411, 412
See application file for complete search history.

(56) References Cited

U.S. PATENT DOCUMENTS

| | | | |
|---|---|---|---|
| 7,969,206 B2 * | 6/2011 | Ito ................................. | 327/108 |
| 8,138,818 B2 * | 3/2012 | Tsunoda et al. ............. | 327/374 |
| 8,633,755 B2 * | 1/2014 | Kawamoto et al. ........... | 327/309 |
| 2003/0040343 A1 | 2/2003 | Epperson | |
| 2007/0008679 A1 | 1/2007 | Takahasi | |
| 2008/0290853 A1 | 11/2008 | Ito | |
| 2009/0002054 A1 | 1/2009 | Tsunoda | |
| 2012/0126859 A1 | 5/2012 | Kawamoto | |
| 2014/0111253 A1 * | 4/2014 | Fukuta et al. ................. | 327/109 |

FOREIGN PATENT DOCUMENTS

| | | | |
|---|---|---|---|
| JP | 1994-090156 A | 3/1994 | |
| JP | 2005-136560 A | 5/2005 | |

* cited by examiner

*Primary Examiner* — An Luu
(74) *Attorney, Agent, or Firm* — Posz Law Group, PLC

(57) ABSTRACT

A gate drive circuit includes a power supply circuit that has an output switch function for switching a voltage value of a drive voltage between two levels, a gate-ON drive circuit that outputs a constant electric current toward a gate of an IGBT from an output terminal of the power supply circuit, and a control section performs a constant electric current drive of a gate of the IGBT at a time of a turn-ON by operating the gate-ON drive circuit. At a turn-ON start time, the control section sets the drive voltage to a relatively-high first set value, and then switches the drive voltage to a relatively-low second set value at a switch timing after a mirror period end time.

9 Claims, 15 Drawing Sheets

GATE DRIVE CIRCUIT

CROSS REFERENCE TO RELATED APPLICATION

The present application is based on and claims the benefit of priority of Japanese Patent Application No. 2013-047951, filed on Mar. 11, 2013, the disclosure of which is incorporated herein by reference.

TECHNICAL FIELD

The present disclosure generally relates to a gate drive circuit of a transistor.

BACKGROUND

Conventionally, a gate of a transistor such as an IGBT or the like is driven by a gate drive circuit, which typically drives the gate of the transistor by a constant electric current drive. In such configuration, it may be preferable to set up a power supply voltage for a current regulator circuit that supplies the constant electric current to have a certain voltage value, in order to satisfy an operating range of the current regulator circuit for the supply of the constant current toward the gate of the IGBT. Therefore, a gate voltage at a time of an ON operation of the IGBT performed in a saturation region (i.e., at a time of Full-ON) may become higher than required. If the gate voltage is too high and exceeds a gate dielectric breakdown voltage VGEs of the IGBT, a problem may arise, such as a deterioration of the reliability of a gate oxide film, a shortened life of the IGBT, and the like.

On the other hand, the disclosure in a patent document 1 (i.e., Japanese Patent Laid-Open No. 2009-011049) describes a gate driver, which is configured to perform a constant electric current drive of the gate of the IGBT by a current regulator circuit at a turn-ON start time and is configured to switch to perform a constant voltage drive by a constant voltage drive circuit at a certain timing before the Full-ON of the IGBT. In this case, a voltage of a dedicated power supply $V_{DD2}$ of a current regulator circuit is set up to be higher than a voltage of a dedicated power supply $V_{DD1}$ of a constant voltage drive circuit. Therefore, the gate voltage at the time of Full-ON is restricted, while the operating range of the current regulator circuit is being secured.

However, in the gate driver in the disclosure of the patent document 1, two drive circuits (i.e., a current regulator circuit and a constant voltage drive circuit) and two power supplies (i.e., a dedicated power supply $V_{DD1}$ and a dedicated power supply $V_{DD2}$) are required. Therefore, a circuit configuration is complicated in such a gate driver. Further, the manufacturing cost of such a driver is high.

SUMMARY

It is an object of the present disclosure to provide a gate drive circuit that is characterized by (i) a stable operation of the current regulator circuit realized in an operating range of the current regulator circuit and (ii) a long-life gate oxide film, while preventing an increase of a manufacturing cost.

In an aspect of the gate drive circuit is provided with a drive voltage generation circuit, a current regulator circuit, a drive control section, and a voltage switchover control section. The drive voltage generation circuit outputs a drive voltage for performing an ON drive of a transistor, and has a function which switches a voltage value of the drive voltage to be output in at least two levels. The current regulator circuit outputs a constant electric current toward a gate terminal of the transistor from an output terminal of the drive voltage generation circuit. If an ON command is inputted, the drive control section operates the current regulator circuit, and performs a constant electric current drive of the gate of the transistor. The voltage switchover control section sets a voltage value of the drive voltage generated by the drive voltage generation circuit to one of two values, i.e., to a first set value or to a second set value that is lower than the first set value.

Since a turn-ON period of a transistor between a turn-ON start time and a mirror period end time can be shortened if a gate of the transistor is driven by the constant electric current drive, a switching loss reduction effect is maximized, i.e., a switching loss for such a turn-ON period is decreased. On the other hand, in a period after the mirror period end time, the above-described effect by the constant electric current drive is reduced. In view of such observation, the voltage switchover control section sets a voltage value of the drive voltage to the first set value upon having an input of the ON command, and then switches a set value of the drive voltage to the second set value at a predetermined switch timing after an end of the mirror period of the transistor.

In such manner, since a relatively high drive voltage is provided to the current regulator circuit during a period between a turn-ON start time and a mirror period end time, the operation range of a transistor is securely reserved. Further, since a relatively low drive voltage is provided to the current regulator circuit during a period after the mirror period end time, the gate voltage at the time of Full-ON does not become very high. Therefore, a problem such as a deterioration of the reliability (i.e., a lifetime) of the gate oxide film of the transistor and the like will not arise. Further, the above-mentioned configuration has one power supply (i.e., a drive voltage generation circuit) and one drive circuit (i.e., a current regulator circuit). Therefore, in the above-mentioned configuration, the problems observed in the conventional circuit configuration, that is, the complicated circuit configuration, leading to an increase of the manufacturing cost, will no longer arise. Therefore, according to the present disclosure, while suppressing the increase of the manufacturing cost, a secure operation in the operating range of the current regulator circuit enabling a secure operation of such circuit is realized, together with the prevention of deteriorated reliability of the gate oxide film.

The voltage switchover control section may also set a switch timing for the switching of the drive voltage to a point of time that is after a lapse of a preset period from an input of the ON command. However, a delay time, which is caused by the circuit, between (i.e., from) the input of the ON command and (i.e., to) a start of the rise of the gate voltage VG may vary time to time (i.e., the delay time varies depending on a situation). Therefore, in the above-mentioned setup of the switch timing, the switch timing is also changed according to the variation of the delay time. In order to improve such a point, a scheme of the present disclosure may be adopted. That is, the gate drive circuit is provided with a gate voltage detection circuit which detects the gate voltage of the transistor. Further, the voltage switchover control section sets the switch timing to a certain point in time that is after a lapse of a predetermined time from a detection time at which a detection value of the gate voltage detection circuit rises to a certain voltage. In such manner, regardless of the delay time of the circuit, the switch timing is set up accurately to a target point. The above-mentioned certain voltage (i.e., a certain detection value) may be a voltage that is lower than the mirror voltage (i.e., a first determination threshold).

The mirror period of a transistor may vary according to a characteristic of an element (i.e., a threshold voltage of the element), a magnitude of load current and the like. Therefore, in each of the above-mentioned configurations, after taking the variation range of the mirror period into account, it may be preferable to perform a detailed timing design so that the switch timing is set to a point in time before the Full-ON timing. Such a timing design may be simplified by adopting a following scheme.

The gate drive circuit of the present disclosure has a clamp circuit which restricts the gate voltage of the transistor to be less than a limit voltage that is higher than the mirror voltage and lower than the second set value. Further, if an ON command is inputted, the clamp circuit starts its operation, and continues the operation until at least the switch timing arrives. In such manner, by a time of completion of the switching of the drive voltage (i.e., until the switch timing arrives), the clamp circuit is always operated and the gate voltage is clamped to be less than the limit voltage, thereby preventing the transistor from being turned ON to the Full-ON state. Therefore, according to a configuration of the present disclosure, the drive voltage can be changed to the second set value, which is a relatively low voltage, before the Full-ON timing of the transistor without regard to the variation of the mirror period.

The clamp circuit having other configuration outputs a clamp detection signal to the voltage switchover control section, if the gate voltage rises to the limit voltage and is thus restricted. Further, the voltage switchover control section sets the switch timing to a point in time of receiving the clamp detection signal. In such manner, regardless of the length of the mirror period, the switching of the gate voltage is performed at a timing at which the gate voltage rises to the limit voltage. Therefore, according to such configuration, immediately before the transistor is turned ON to the Full-ON state, the drive voltage is changed to the second, relatively low, set value, regardless of the variation of the mirror period.

The gate drive circuit of the present disclosure is provided with a gate voltage detection circuit which detects the gate voltage of a transistor. Further, the voltage switchover control section sets the switch timing to a point in time at which the detection value of the gate voltage detection circuit rises to a second determination threshold that is higher than the mirror voltage of the transistor and is lower than the second set value. In such manner, regardless of the length of the mirror period, the switching of the drive voltage is performed at a time when the gate voltage rises to the second determination threshold. Therefore, according to such configuration, immediately before the transistor is turned ON to the Full-ON state, the drive voltage is changed to the second, relatively low, set value, regardless of the variation of the mirror period.

BRIEF DESCRIPTION OF THE DRAWINGS

Other objects, features and advantages of the present disclosure will become more apparent from the following detailed description disposed with reference to the accompanying drawings, in which.

DETAILED DESCRIPTION

Embodiments of a gate drive circuit are described in the following with reference to the drawings. In each of those embodiments, the same numerals are associated with substantially the same components, and an explanation of the same component will not be repeated.

(First Embodiment)

The first embodiment of the present disclosure is described with reference to FIGS. 1 to 5.

Figure 1:
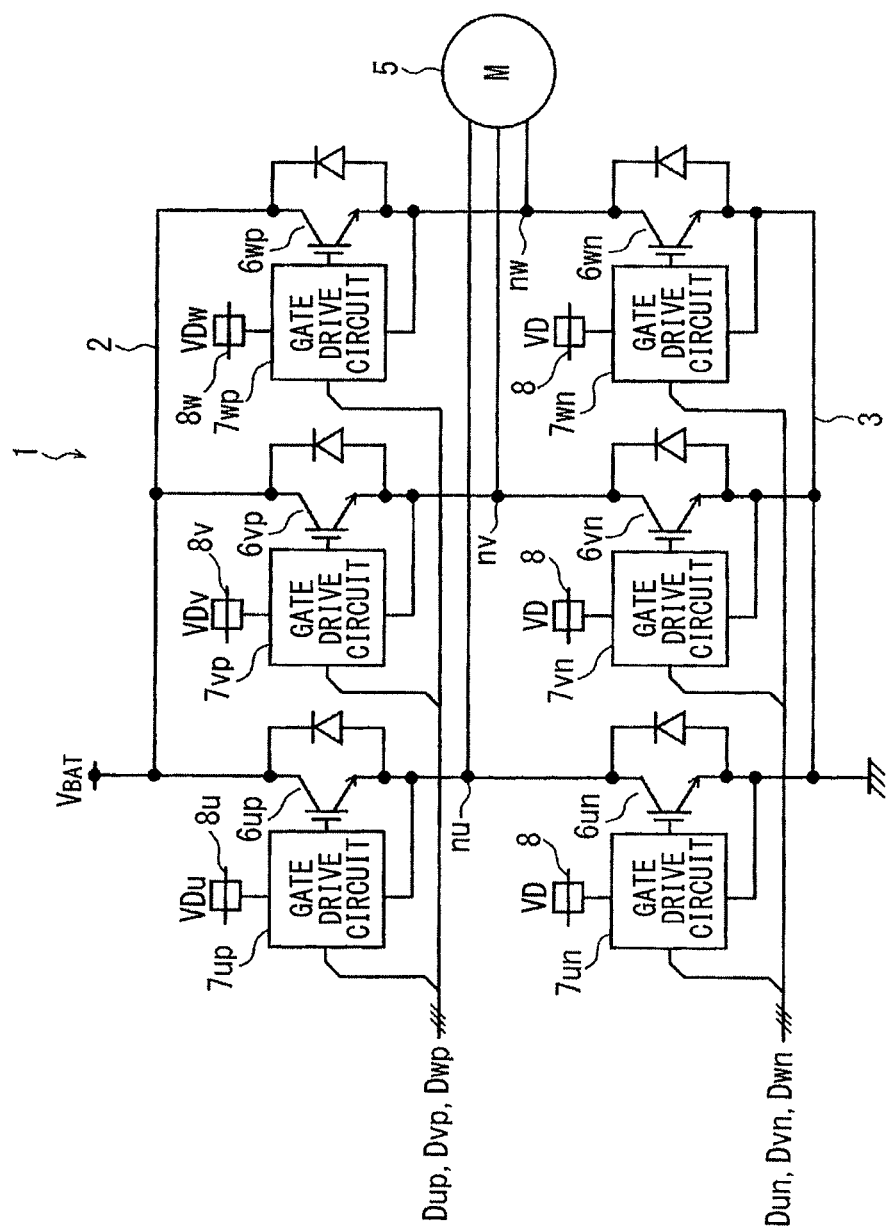
FIG. 1 is a schematic diagram of an inverter in a first embodiment of the present disclosure.

An inverter 1 shown in FIG. 1 receives a supply of a direct current voltage $V_{BAT}$ from an in-vehicle battery via power source wires 2 and 3, and outputs an alternating voltage to a brushless DC motor 5 according to PWM control signals Dup, Dvp, Dwp, Dun, Dvn, and Dwn that are provided via a photo coupler from a control section which comprises a microcomputer etc. (i.e., a numeral 4 is attached to it in FIG. 2).

Between the power source wires 2 and 3, three upper arm IGBTs 6up, 6vp, 6wp, and three lower arm IGBTs 6un, 6vn, 6wn are connected as three phase bridge rectifiers. Each of the IGBTs 6up-6wn has a reflux diode connected in parallel. Each of the IGBTs 6up-6wn is constituted as an individual module including an IGBT for a current sense, respectively. The IGBTs 6up-6wn are driven by gate drive circuits 7up-7wn that are constituted as individual ICs, respectively.

Power supply voltages VDu, VDv, and VDw are supplied to the upper arm gate drive circuits 7up, 7vp, 7wp via power source wires 8u, 8v, 8w which have, respectively, output nodes nu, nv, nw, as reference potentials. A power supply voltage VD is supplied to the lower arm gate drive circuits 7un, 7vn, 7wn via a power source wire 8 which has a ground as a reference potential. The gate drive circuits 7up-7wn have the same configuration. Therefore, they are "generalized" and collectively designated as a gate drive circuit 7, and the IGBTs 6up-6wn are also generalized as IGBT 6 (i.e., equivalent to a transistor in the claims), together with PWM control signal Dup-Dwn generalized as a control signal D, for the brevity of the following description.

Figure 2:
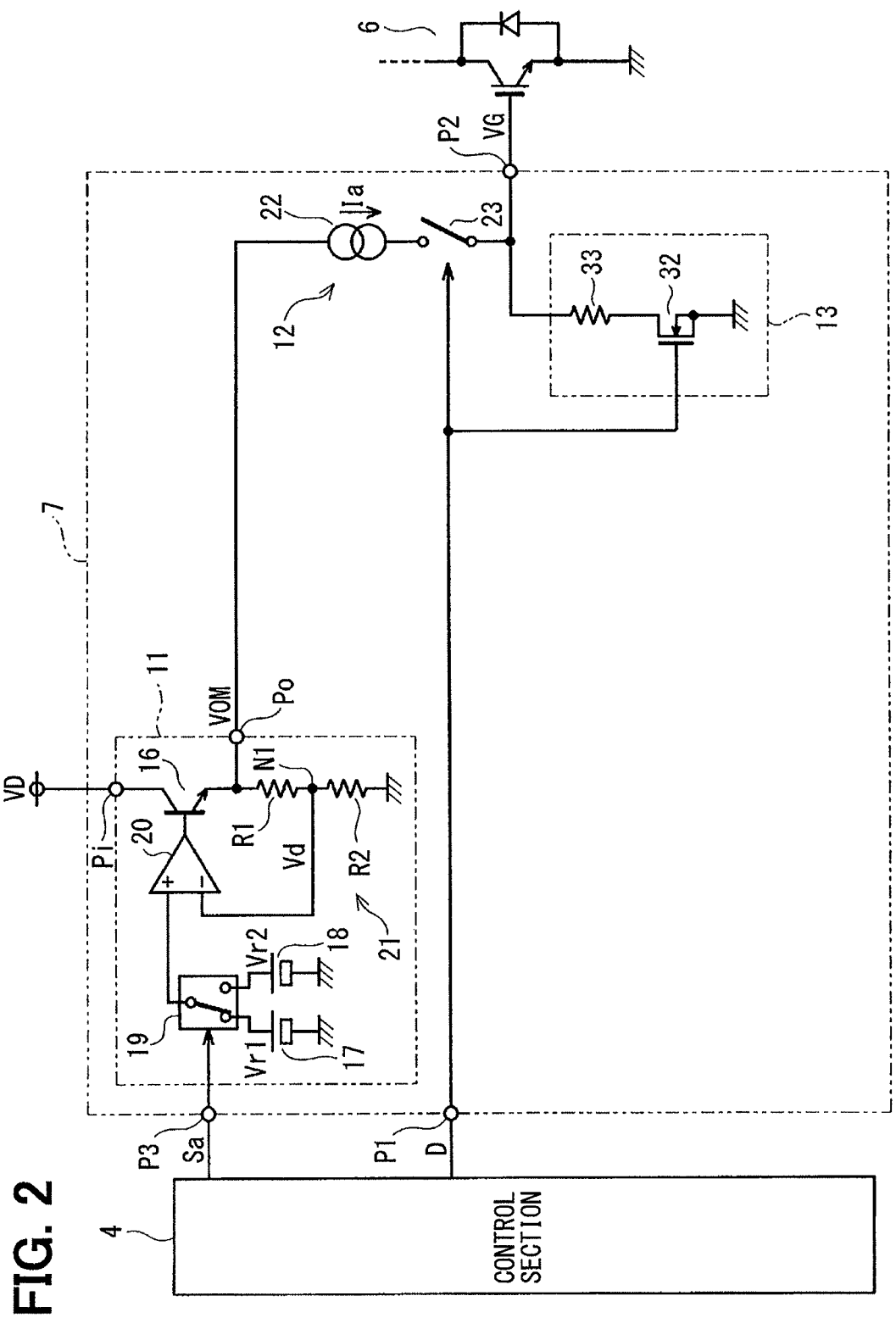
FIG. 2 is a schematic diagram of a gate drive circuit.

As shown in FIG. 2, the gate drive circuit 7 is provided with a power supply circuit 11 (i.e., equivalent to a drive voltage generation circuit in the claims), a gate-ON drive circuit 12 (i.e., equivalent to a current regulator circuit in the claims), and a gate-OFF drive circuit 13. In the present embodiment, a control section 4 is equivalent to a drive control section and a voltage switchover control section in the claims. A terminal P1 of an IC is an input terminal of a control signal D, and a terminal P2 of the IC is an output terminal of a gate voltage VG. When the control signal D is at the H level, it is in a state where an OFF command is provided to the gate drive circuit 7. When the control signal D is at the L level, it is in a state where an ON command is provided to the gate drive circuit 7. A terminal P3 of the IC is an input terminal of a voltage switch signal Sa that is mentioned later.

The power supply circuit 11 is a series regulator type power supply circuit which lowers the power supply voltage VD inputted via an input terminal Pi to a desired voltage and outputs the lowered voltage through an IGBT 6. The voltage outputted from the IGBT 6 of the power supply circuit 11 serves as a drive voltage $V_{OM}$ for performing an ON drive of the IGBT 6.

Further, the power supply circuit 11 has a function which switches a value of the drive voltage $V_{OM}$ between two levels, to be output according to the level of the voltage switch signal Sa provided by the control section 4. Specifically, the power supply circuit 11 switches the value of the drive voltage $V_{OM}$ to a first set value $V_{OM1}$, when the voltage switch signal Sa is at the H level. Further, the power supply circuit 11 switches the value of the drive voltage $V_{OM}$ to a second set value $V_{OM2}$ lower than the first set value, when the voltage switch signal Sa is at the L level. The setups of how the first set value $V_{OM1}$ and the second set value $V_{OM2}$ are configured are mentioned later.

The power supply circuit 11 is provided with a transistor 16, reference voltage generation circuits 17 and 18, a change-over switch 19, an OP amplifier 20, and a voltage detection circuit 21. The transistor 16 is a bipolar transistor of a NPN type, and is connected between the input terminal Pi and the output terminal Po. The reference voltage generation circuits 17 and 18 are constituted as a band gap reference circuit or the like, for example.

The reference voltage generation circuit 17 is a voltage source which generates a first reference voltage Vr1 for setting the first set value $V_{OM1}$, which is the first target value of the drive voltage $V_{OM}$. The reference voltage generation circuit 18 is a voltage source which generates a second reference voltage Vr2 for setting the second set value $V_{OM2}$, which is the second target value of the drive voltage $V_{OM}$. The first reference voltage Vr1 outputted from the reference voltage generation circuit 17 is provided to one of the two switching terminals of the change-over switch 19. The second reference voltage Vr2 outputted from the reference voltage generation circuit 18 is provided to the other one of the two switching terminals of the change-over switch 19. A common terminal of the change-over switch 19 is connected to a non-inverted input terminal of the OP amplifier 20.

The change-over switch 19 is switched according to the level of the voltage switch signal Sa provided by the control section 4. More specifically, when the voltage switch signal Sa is at the H level, the change-over switch 19 is switched so that the one of the two switching terminals is conductive to the common terminal. Thereby, the first reference voltage Vr1 is provided to the non-inverted input terminal of the OP amplifier 20. Further, when the voltage switch signal Sa is at the L level, the change-over switch 19 is switched so that the other one of the two switching terminals is conductive to the common terminal. Thereby, the second reference voltage Vr2 is provided to the non-inverted input terminal of the OP amplifier 20.

The voltage detection circuit 21 is provided as a series circuit of resistors R1 and R2. The series circuit of the resistors R1 and R2 is positioned between (i.e., is connected to both of) the output terminal Po and the ground. A detection voltage Vd of a common node N1 between the resistors R1 and R2, i.e., a voltage as a result of division of the drive voltage $V_{OM}$ by the resistors R1 and resistor R2, is applied to an inverted input terminal of the OP amplifier 20. A ratio of the resistors R1 and R2 (i.e., a division voltage ratio) is set to a value that, (i) when the drive voltage $V_{OM}$ is the first set value $V_{OM1}$, the detection voltage Vd is equated with the first reference voltage Vr1, and, (ii) when the drive voltage $V_{OM}$ is the second set value $V_{OM2}$, the detection voltage Vd is equated with the second reference voltage Vr2. The OP amplifier 20 outputs, to the base of the transistor 16, an error amplification signal that corresponds to a difference between the detection voltage Vd and the first reference voltage Vr1 or the second reference voltage Vr2. The drive of the transistor 16 is controlled by such error amplification signal.

The gate-ON drive circuit 12 is provided with an electric current output circuit 22 and a switch 23. The gate-ON drive circuit 12 equivalent to a current regulator circuit in the claims. The electric current output circuit 22 and the switch 23 are connected in series between the output terminal Po of the power supply circuit 11 and the terminal P2. The electric current output circuit 22 outputs a constant electric current Ia toward a gate terminal of the IGBT 6 from the output terminal Po. Opening and closing (i.e., ON and OFF) of the switch 23 are controlled according to the control signal D provided by the control section 4. More specifically, when the control signal D is at the L level, the switch 23 is turned ON, and when the control signal D is at the H level, the switch 23 is turned OFF.

By the above-mentioned configuration, the gate-ON drive circuit 12 performs an output operation of the electric current Ia, when the control signal D is at the L level (i.e., when an ON command is inputted). In such manner, a gate capacitance is charged by the constant electric current Ia, causing a rise of a gate voltage VG which leads to a turn-ON of the IGBT 6. That is, when the gate drive circuit 7 of the present embodiment turns ON the IGBT 6, it performs a constant electric current drive of the gate of the IGBT 6. At such time, the gate voltage VG of the IGBT 6 rises until it rises to the drive voltage $V_{OM}$. The gate-ON drive circuit 12 stops the output operation of the electric current Ia, when the control signal D is at the H level (i.e., when an OFF command is inputted).

Figure 3A:
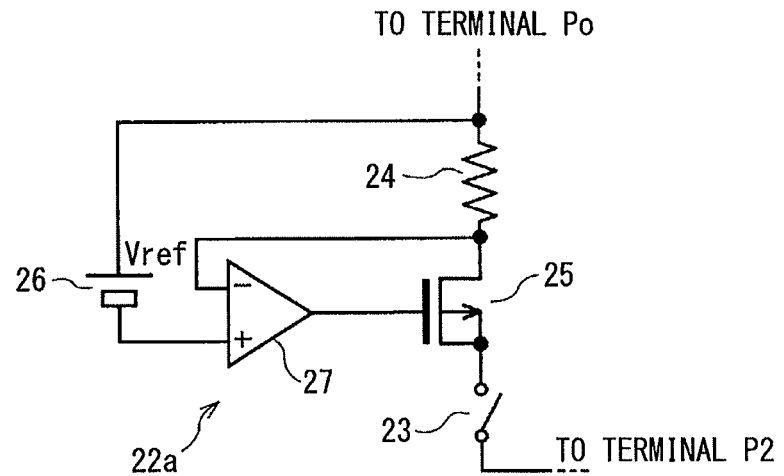
FIGS. 3A/B are schematic diagrams of two examples of a gate-ON drive circuit.
Figure 3B:
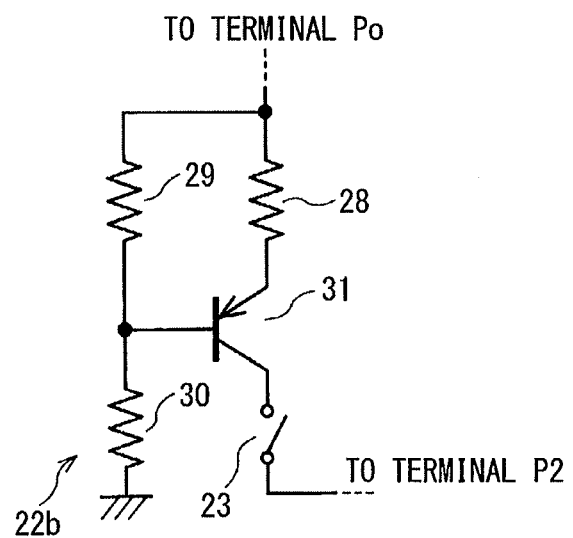
Figure 4:
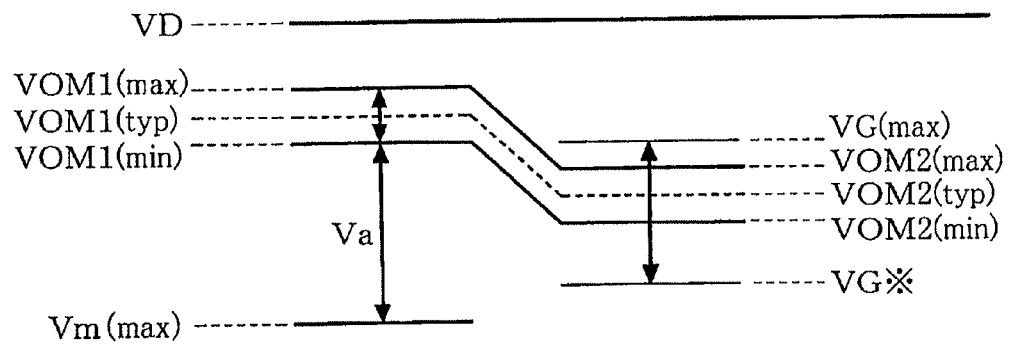
FIG. 4 is a diagram of a first setting value and a second setting value of a drive voltage.

As the electric current output circuit 22 of the gate-ON drive circuit 12, an amplifier configuration as shown, for example, in FIG. 3A, and a transistor configuration as shown in FIG. 3B are employable. As shown in FIG. 3A, an electric current output circuit 22a of the amplifier configuration is provided with a resistor 24, a P channel type MOS transistor 25, a reference voltage generation circuit 26 generating a reference voltage Vref and an OP amplifier 27. In this case, at a position between the output terminal Po of the power supply circuit 11 and the switch 23, the resistor 24 and the transistor 25 are connected in series. A high potential side terminal of the reference voltage generation circuit 26 is connected to the output terminal Po, and a low potential side terminal is connected to the non-inverted input terminal of the OP amplifier 27. The other terminal of the resistor 24 is connected to an inverted input terminal of the OP amplifier 27. An output signal of the OP amplifier 27 is provided to the gate of the transistor 25.

Further, as shown in FIG. 3B, an electric current output circuit 22b of the transistor configuration is provided with resistors 28 to 30 and a bipolar transistor 31 of a PNP type. In this case, at a position between the output terminal Po and the switch 23, a resistor 28 and a transistor 31 are connected in series. Further, at a position between the output terminal Po and the ground, a series connection of resistors 29 and 30 is connected. A common node between the resistors 29 and 30 is connected to the base of the transistor 31.

The electric current output circuit 22 of the above configuration can output the constant electric current Ia, when a voltage between the input terminal and the output terminal of the gate-ON drive circuit 12 (i.e., a voltage difference between the drive voltage $V_{OM}$ and the gate voltage VG) is equal to or higher than an operation guarantee voltage. In other words, the electric current output circuit 22 cannot output the constant electric current Ia, when the voltage between the input terminal and the output terminal is less than the operation guarantee voltage, and the output electric current decreases according to the voltage between the input terminal and the output terminal.

The gate-OFF drive circuit 13 is provided with a transistor 32 and a resistor 33. The transistor 32 is an N channel type MOS transistor, and the drain of the transistor 32 is connected to the terminal P2 via the resistor 33, and the sauce of the transistor 32 is connected to the ground. The control signal D is provided to the gate of the transistor 32.

In such configuration, when the control signal D is at the H level (i.e., when an OFF command is inputted), an electric current path is formed from the gate of the IGBT 6 to the ground (i.e., the emitter of the IGBT 6) via the resistor 33 and the transistor 32. Due to such an electric current path, the gate capacitance is discharged according to a time constant that is determined by a resistance value of the resistor 33 and the like, causing a drop of the gate voltage VG which leads to a turn-OFF of the IGBT 6.

Then, the setups of the first set value $V_{OM1}$ and the second set value $V_{OM2}$ in the power supply circuit 11 are described. The first set value $V_{OM1}$ and the second set value $V_{OM2}$ are set up in consideration of allowances of the values $V_{OM1}$ and $V_{OM2}$ (i.e., a difference between a minimum value—a maximum value of each of $V_{OM1}$ and $V_{OM2}$). That is, a value $V_{OM1}$ (typical) and a value $V_{OM2}$ (typical) are set up according to their allowances (see FIG. 4). Hereafter, the concrete setup conditions are described. The first set value $V_{OM1}$ is set up so that the minimum value of $V_{OM1}$, i.e., $V_{OM1}$ (min), fulfills the following equation (1). In the following equation (1), the maximum value of the mirror voltage of the IGBT 6 is designated as Vm (max), and the operation guarantee voltage of the electric current output circuit 22 is designated as Va.

$$V_{OM1}(\min) > Vm(\max) + Va \tag{1}$$

The second set value $V_{OM2}$ is set to a value that fulfills two conditions, i.e., a first condition of "preventing a reliability deterioration of the gate oxide film of the IGBT 6", and a second condition of "a loss of the Full-ON operation of the IGBT 6 is restricted to be smaller than a desired value". Further, the above-mentioned Full-ON operation is an ON operation in a saturation region, and, at such a Full-ON operation time, the IGBT 6 is in a state of sufficiently-low turn-ON resistance, in that case. The second set value $V_{OM2}$ is set up so that the minimum value $V_{OM2}$ (min) fulfills the following equation (2), and the maximum value $V_{OM2}$ (max) fulfills the following equation (3). In those equations (2) and (3), a gate voltage value, which enables a loss of the Full-ON operation of the IGBT 6 to be smaller than the desired value, is designated as VG*, and another gate voltage value, which fulfills a specification of the gate dielectric breakdown voltage, is designated as VG (max).

$$V_{OM2}(\min) > VG* \tag{2}$$

$$V_{OM2}(\max) < VG(\max) \tag{3}$$

Figure 5:
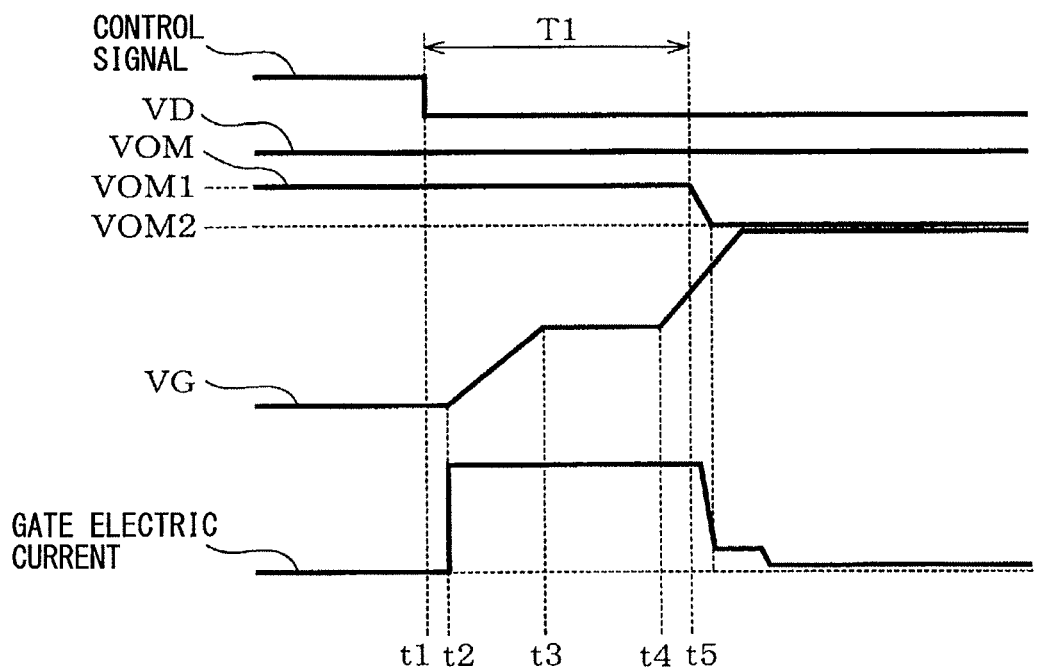
FIG. 5 is a correlation diagram of a signal, a voltage and an electric current in each of various parts at a turn-ON time.

Then, a turn-ON operation of the gate drive circuit 7 when performing a turn-ON of the IGBT 6 is described, referring to FIG. 5. FIG. 5 shows an outline of a correlation of wave forms of the control signal D, the power supply voltage VD, the drive voltage $V_{OM}$, the gate voltage VG, and the electric current (i.e., a gate electric current) which charges the gate capacitance.

If the control signal D is switched to the L level (i.e., an ON command) from the H level (i.e., an OFF command) at time t1, the switch 23 of the gate-ON drive circuit 12 is turned ON, and the charging of the gate capacitance is started, thereby the rise of the gate voltage VG starts at time t2. The control section 4 sets the voltage switch signal Sa to the H level at time t1 or before time VI. Thereby, the power supply circuit 11 is switched to a state of outputting the drive voltage $V_{OM}$ that is set to the first set value $V_{OM1}$. In this case, there is a delay of time between time t1, at which an ON command is provided, and time t2, at which the gate voltage VG actually starts to rise, due to the operation of the switch 23 and the like.

Further, the control section 4 starts a time measurement of a first setup time T1 at time t1 which is an inversion timing of the control signal D. The first setup time T1 is the duration of time that determines a switch timing for switching the drive voltage $V_{OM}$ of the power supply circuit 11 from the first set value $V_{OM1}$ to the second set value $V_{OM2}$. The first setup time T1 is set up so that the above-mentioned switch timing comes to a point in time somewhere after a mirror period end time.

Then, if the gate voltage VG rises to a threshold voltage of the IGBT 6, the IGBT 6 is turned ON. During the turn-ON of the IGBT 6, there is a mirror period (i.e., a period between time t3 and time t4) in which the gate voltage VG is kept at a mirror voltage Vm. After the end of such mirror period, a lapse of the first setup time T1 from time t1 ends at time t5. Then, the control section 4 sets the voltage switch signal Sa to the L level, Thereby, the power supply circuit 11 is switched to a state of outputting the drive voltage $V_{OM}$ that is set to the second set value $V_{OM2}$. Then, the drive voltage $V_{OM}$ falls to the second set value $V_{OM2}$. Further, as the drive voltage $V_{OM}$ falls to the second set value $V_{OM2}$, the electric current Ia (i.e., the gate current) which is output by the electric current output circuit 22 also falls according to the fall of the drive voltage $V_{OM}$. Then, the gate voltage VG rises up to the second set value $V_{OM2}$, and the ON operation of the IGBT 6 is performed in a saturation region (i.e., Full-ON is performed).

As described above, in the gate drive circuit 7 of the present embodiment, at a start of the turn-ON, the drive voltage $V_{OM}$ is set to the first set value $V_{OM1}$ which is relatively high, and the drive voltage $V_{OM}$ is switched to the relatively low second set value $V_{OM2}$ at the switch timing after the end of the mirror period. In such manner, the voltage between the input terminal and the output terminal of the gate-ON drive circuit 12 is kept at a high value, securing an output operation for outputting the constant electric current Ia by the electric current output circuit 22 during a period between the turn-ON start time and the mirror period end time. Therefore, the constant electric current drive of the gate is performed in a period between the start of the turn-ON of the IGBT 6 and the end of the mirror period, which results in a shortened turn-ON period, effecting a reduction of the switching loss. Further, in a period after the end of the mirror period, the drive voltage $V_{OM}$ is to the second set value $V_{OM2}$, which is a relatively low voltage, the gate voltage VG of the IGBT 6 will rise only to the second set value $V_{OM2}$, at most. Therefore, the gate voltage VG of the IGBT 6 at the time of Full-ON operation does not rise to a very high voltage, thereby preventing a problem, such as a deterioration of the reliability (i.e., a lifetime) of the gate oxide film and the like.

Further, the gate drive circuit 7 is configured to perform the turn-ON operation of the IGBT 6 by using (I) one power supply (i.e., the power supply circuit 11) and (ii) one drive circuit (i.e., the gate-ON drive circuit 12). More specifically, the power supply circuit 11 has a function that switches the drive voltage $V_{OM}$ to be output in two levels, which is realized by the switching between the reference voltage Vr1 and the reference voltage Vr2 respectively generated by the two voltage sources (i.e., the reference voltage generation circuits 17 and 18), without having/using two power supplies.

On the other hand, two power supplies and two drive circuits were required in the conventional technique for performing the turn-ON operation. That is, the configuration of the gate drive circuit 7 to perform the turn-ON operation is simplified in comparison to the conventional configuration.

Therefore, while realizing the secure operation in an operating range of the gate-ON drive circuit 12, the drive circuit 12 in the present embodiment is manufactured without an increase of the manufacturing cost and is enabled a prevention of the reliability deterioration of the gate oxide film or the like.

According to the present embodiment, the switch timing of the drive voltage $V_{OM}$ is determined according to the first setup time T1 that is measured from the switch timing of the control signal D switched from the H level to the L level. Therefore, after taking the following points into consideration, it may be preferable to perform a detailed timing design about the first setup time T1 in the present embodiment.

That is, the length of the mirror period of the IGBT 6 and the end timing of the mirror period, more specifically, may vary depending on the characteristic (i.e., a threshold voltage) of the element, the magnitude of the load electric current, and the like (i.e., an individual difference). Further, the mirror period may be very short, or may be substantially zero. In such a case, if the first setup time T1 is set up based on an assumption that the mirror period has a certain length of time, the switching of the drive voltage $V_{OM}$ may not be properly performed before the Full-ON, because, little or no mirror period means that the Full-ON comes earlier than expected. If the drive voltage $V_{OM}$ is not switched to the lower level, the reliability deterioration of the gate oxide film may be caused. Further, if the mirror period is longer than expected, the switching of the drive voltage $V_{OM}$ may be performed in the middle of the mirror period. If the switching of the drive voltage $V_{OM}$ is performed in such manner, the operating range of the electric current output circuit 22 may become insecure.

In consideration of such points, in the present embodiment, the variation range of the mirror period, i.e., the minimum and the maximum of the mirror period, may preferably be calculated based on the characteristic of various candidate IGBTs 6, which are an object of driving (i.e. which may be driven by the drive circuit 12 of the present embodiment), and the first setup time T1 may preferably be set to a certain value that covers an entire variation of the calculated variation range of the mirror period, in order to enable an appropriate switching of the drive voltage $V_{OM}$ in the mirror period (i.e., so that the switching of the drive voltage $V_{OM}$ is performed after the end of the mirror period and before the Full-ON timing).

(Second Embodiment)

Hereafter, the second embodiment of the present disclosure is described with reference to FIGS. 6 and 7.

Figure 6:
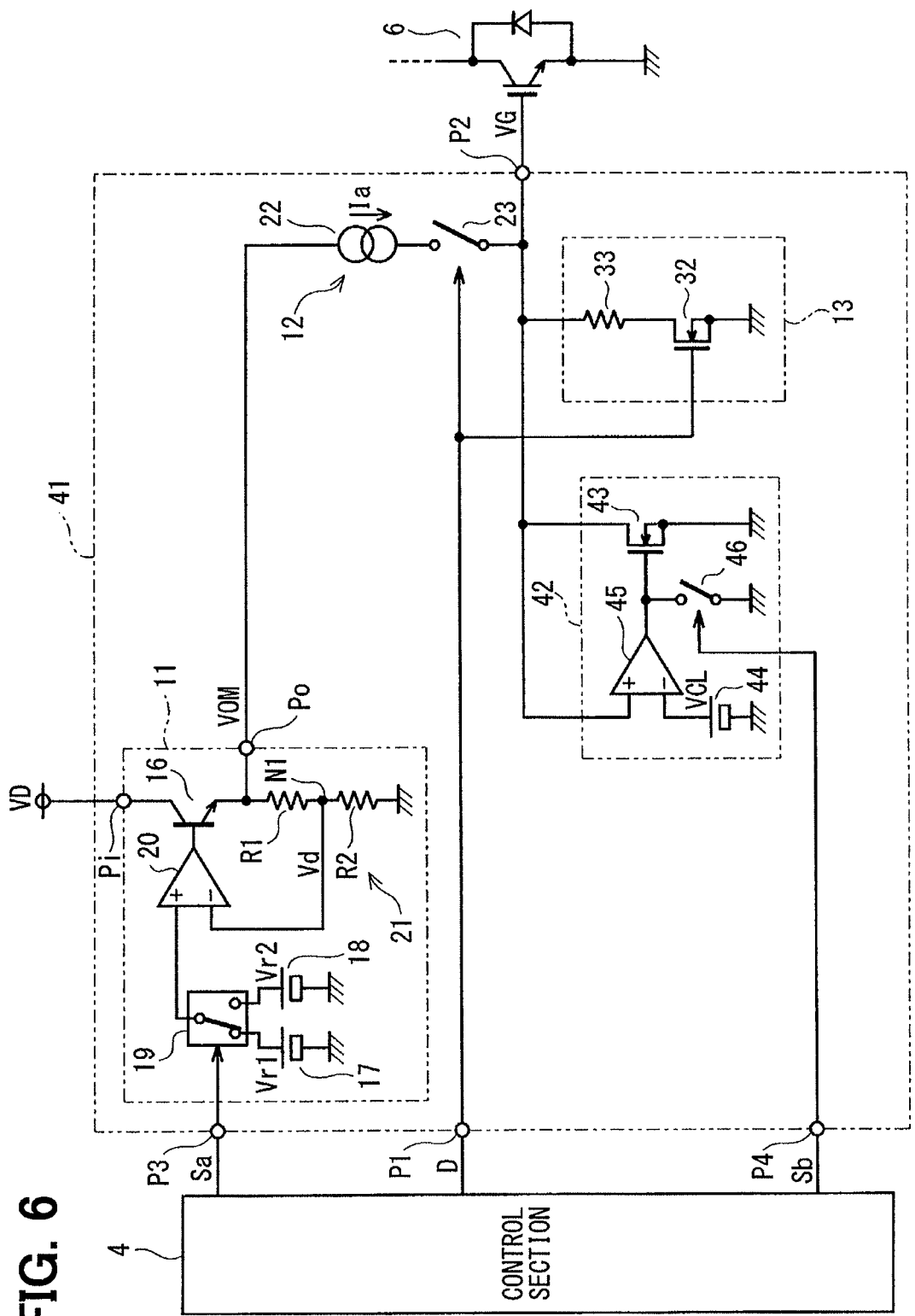
FIG. 6 is a schematic diagram of the gate drive circuit in a second embodiment of the present disclosure, corresponding to FIG. 2.

As shown in FIG. 6, a gate drive circuit 41 of the present embodiment is provided with a clamp circuit 42, which is a difference from the gate drive circuit 7 of the first embodiment.

The clamp circuit 42 performs a clamp operation which restricts the gate voltage VG to be equal to or lower than a limit voltage Vce. The clamp circuit 42 is provided in order to keep the IGBT 6 in an ON state in an active region (i.e., in a half-ON state) and to suppress a short-circuit electric current to have a low value, when a short circuit failure occurs in the inverter 1 or in the motor 5.

The clamp circuit 42 is provided with a transistor 43, a reference voltage generation circuit 44, an OP amplifier 45, and a switch 46. The transistor 43 is an N channel type MOS transistor, and is positioned between the terminal P2 and the ground. The reference voltage generation circuit 44 comprises a band gap reference circuit etc., for example, and is a voltage source which generates the limit voltage $V_{CL}$. The limit voltage $V_{CL}$ is set to a value that is higher than the mirror voltage of the IGBT 6 and is lower than the second set value $V_{OM2}$.

To the OP amplifier 45 the limit voltage $V_{CL}$ and the gate voltage VG are input, and the amplifier 45 outputs, to the gate of the transistor 43, an error amplification signal according to a difference between $V_{CL}$ and VG. The switch 46 is positioned between the gate of the transistor 43 and the ground. The switch 46 is turned ON when a clamp signal Sb is at the L level, and is turned OFF when the signal Sb is at the H level. The clamp signal Sb is provided by the control section 4 via a terminal P4.

According to the above-mentioned configuration, when the clamp signal Sb is at the H level, the clamp operation is performed in the following manner, i.e., when the switch 46 is turned OFF. That is, when the gate voltage VG of the IGBT 6 exceeds the limit voltage $V_{CL}$, the OP amplifier 45 turns ON the transistor 43, and, when the gate voltage VG is less than the limit voltage $V_{CL}$, the OP amplifier 45 turns OFF the transistor 43. Thereby, the gate voltage VG of the IGBT 6 is clamped (i.e., restricted) to be equal to or smaller than the limit voltage $V_{CL}$, irrespective of the applied voltage of the IGBT 6. On the other hand, when the clamp signal Sb is at the L level (i.e., when the switch 46 is turned ON), the clamp circuit 42 stops the above-mentioned clamp operation.

Figure 7:
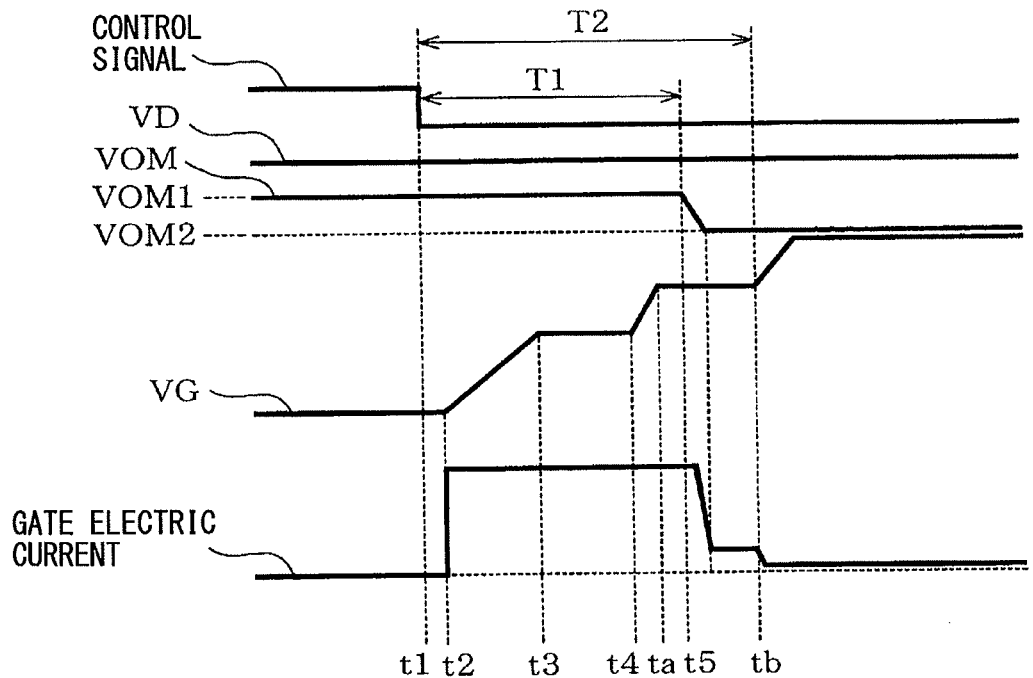
FIG. 7 is a correlation diagram of a signal, a voltage and an electric current in each of various parts at a turn-ON time, corresponding to FIG. 5.

Then, an operation of the gate drive circuit 41 at the time of performing the turn-ON of the IGBT 6 is described, with reference to FIG. 7.

When the control signal D is changed to the L level (i.e., at time t1), the switch 23 of the gate-ON drive circuit 12 is turned ON, which starts the charging of the gate capacitance and also starts the rise of the gate voltage VG (i.e., at time t2). Further, at time t1 or before time t1, the control section 4 sets both of the voltage switch signal Sa and the clamp signal Sb to the H level. Thereby, the power supply circuit 11 is switched to a state of outputting the drive voltage $V_{OM}$ being set to the first set value $V_{OM1}$. Further, the clamp circuit 42 is in a state in which it is capable of performing a clamp operation.

Further, the control section 4 starts a measurement of the first setup time 71 and the second setup time 72 from time t1, which is an inversion timing of the control signal D. The second setup time T2 is a predetermined period of time for determining a stop timing when the operation of the clamp circuit 42 is stopped. The second setup time T2 is set as a predetermined period of time which has some allowance time added to the first setup time T1 (i.e., T2>T1).

When the gate voltage VG rises to the threshold voltage of the IGBT 6, the IGBT 6 is turned ON. Then, at time ta when the gate voltage VG rises to the limit voltage $V_{CL}$ after the mirror period (i.e., time t3-t4), the gate voltage VG is kept at (i.e., restricted to) the limit voltage $V_{CL}$ by the clamp operation of the clamp circuit 42. Further, after the lapse of the first setup time T1 from time t1 (i.e., at time t5), the control section 4 sets the voltage switch signal Sa to the L level. Thereby, the power supply circuit 11 is switched to a state of outputting the drive voltage $V_{OM}$ being set to the second set value $V_{OM2}$. In such manner, the drive voltage $V_{OM}$ falls to the second set value $V_{OM2}$.

Further, after the lapse of the second setup time T2 from time t1 (i.e., at time tb), the control section 4 sets the clamp signal Sb to the L level. Thereby, the clamp operation by the clamp circuit 42 is stopped. In such manner, the gate voltage VG rises up to the second set value $V_{OM2}$, and causes the turn-ON operation of the IGBT 6 in a saturation region.

In a manner described in the present embodiment, the same effects and benefits as the first embodiment are achieved. The gate drive circuit 41 of the present embodiment is provided with the clamp circuit 42 which restricts the gate voltage VG to be equal to or lower than the limit voltage $V_{CL}$ that is lower than the second set value $V_{OM2}$. Further, from at least time t1 at which the ON command is inputted to time t5 or further that is a drive voltage switch timing for switching the drive voltage $V_{OM}$, the clamp circuit 42 is kept in a clamp-enabled state in which the circuit 42 is capable of performing the clamp operation. In such configuration, since the gate voltage VG is securely restricted by the operation of the clamp circuit 42 to be equal to or lower than the limit voltage $V_{CL}$ until a time of completion of the switching of the drive voltage $V_{OM}$, the IGBT 6 will not be switched to the Full-ON state. Therefore, according to the present embodiment, irrespective of the variation of the mirror period of the IGBT 6, the drive voltage $V_{OM}$ is switched to a relatively-low second set value $V_{OM2}$, before the IGBT 6 is switched to the Full-ON state.

(Third Embodiment)

Hereafter, the third embodiment of the present disclosure is described with reference to FIGS. 8 and 9.

Figure 8:
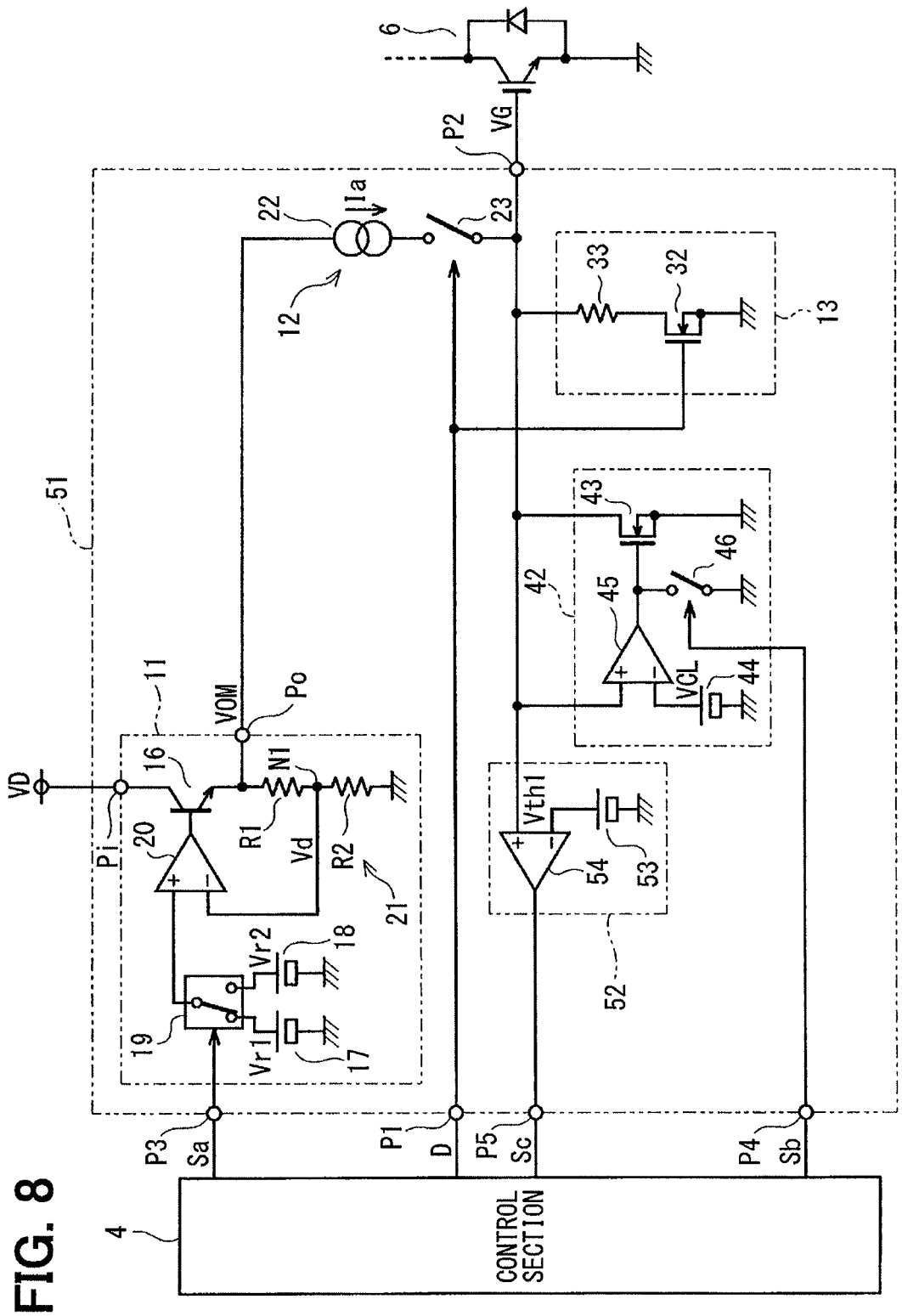
FIG. 8 is a schematic diagram of the gate drive circuit in a third embodiment of the present disclosure, corresponding to FIG. 2.

As shown in FIG. 8, a gate drive circuit 51 of the present embodiment is provided with a gate voltage detection circuit 52, which is a difference from the gate drive circuit 41 of the second embodiment.

The gate voltage detection circuit 52 detects the gate voltage VG of the IGBT 6, and is provided with a reference voltage generation circuit 53 and a comparator 54. The reference voltage generation circuit 53 comprises, for example, a band gap reference circuit etc., and is a voltage source which generates a voltage Vth1, i.e., a first determination threshold value Vth1, The first determination threshold value Vth1 is set as a value that is lower than the mirror voltage of the IGBT 6.

The comparator 54 compares the voltage Vth1 with the gate voltage VG. The output signal of the comparator 54 serves as a voltage detection signal Sc. The voltage detection signal Sc is set to the L level when the gate voltage VG is less than the first determination threshold value Vth, and the signal Sc is set to the H level when the gate voltage VG is equal to or higher than the first determination threshold value Vth1. The voltage detection signal Sc is provided to the control section 4 via a terminal P5.

According to the present embodiment, the following effects and benefits from the other embodiments are achieved.

Figure 9:
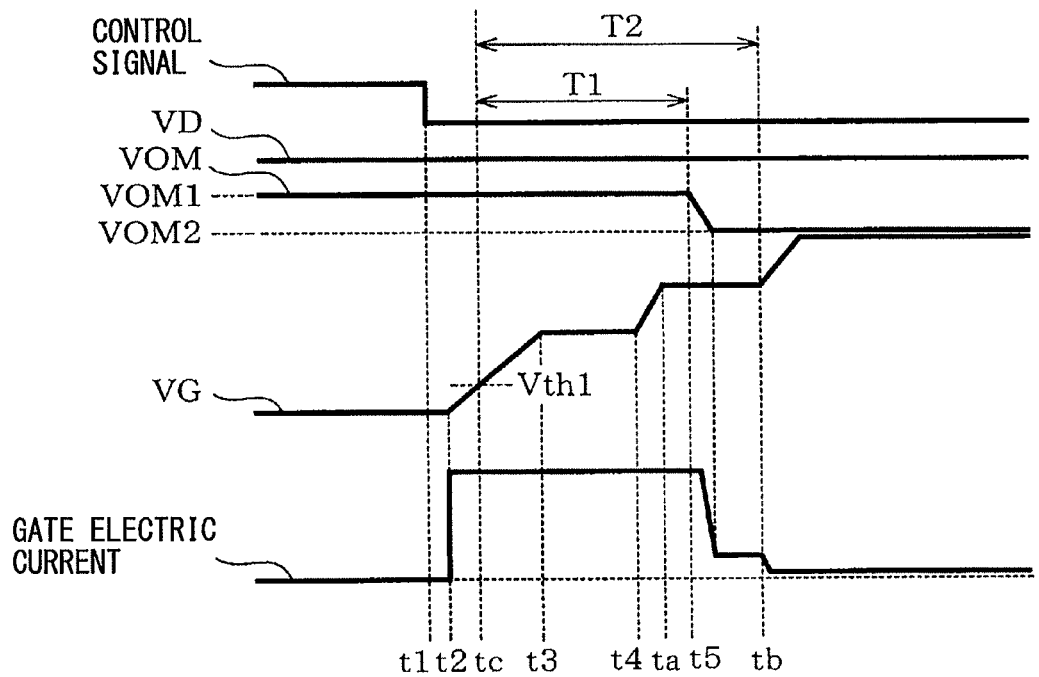
FIG. 9 is a correlation diagram of a signal, a voltage and an electric current in each of various parts at a turn-ON time, corresponding to FIG. 5.

As shown in FIG. 9, the operation at the time of turn-ON of the gate drive circuit 51 of the present embodiment is the same as that of the gate drive circuit 41 of the second embodiment in general. However, the operation of the gate drive circuit 51 differs from the operation of the gate drive circuit 41 at a start time of the measurement of both of the first setup time T1 and the second setup time T2. That is, the control section 4 starts the measurement of the first setup time T1 and the second setup time T2 at time tc, at which the gate voltage VG reaches the first determination threshold value Vth1 that is tower than the mirror voltage Vm, and the voltage detection signal Sc is switched to the H level from the L level.

According to such configuration, the following advantages as well as the same effects and benefits from the other embodiments are achieved, That is, as mentioned above, by the time the gate voltage VG actually starts to rise after the input of an ON command, a delay time is observed due to a circuitry and other factors, and such delay time is not always the same amount of time (i.e., may vary). Therefore, if the input time of an ON command is fixedly set as a measurement start time for the measurement of the first setup time T1, the switch timing of the drive voltage $V_{OM}$ may also vary according to the variation of the above-mentioned delay time. However, as described in the present embodiment, if a time at which the detection value of the gate voltage detection circuit 52 reaches an arbitrary voltage (i.e., the first determination threshold value Vth1) is set as the measurement start time of the first setup time T1, the switch timing of the drive voltage \tem is set to an appropriate timing, i.e., accurately without failure, regardless of the delay time due to the above-mentioned circuit factor and the like, (Fourth Embodiment)

Hereafter, the fourth embodiment of the present disclosure is described with reference to FIGS. 10 and 11.

Figure 10:
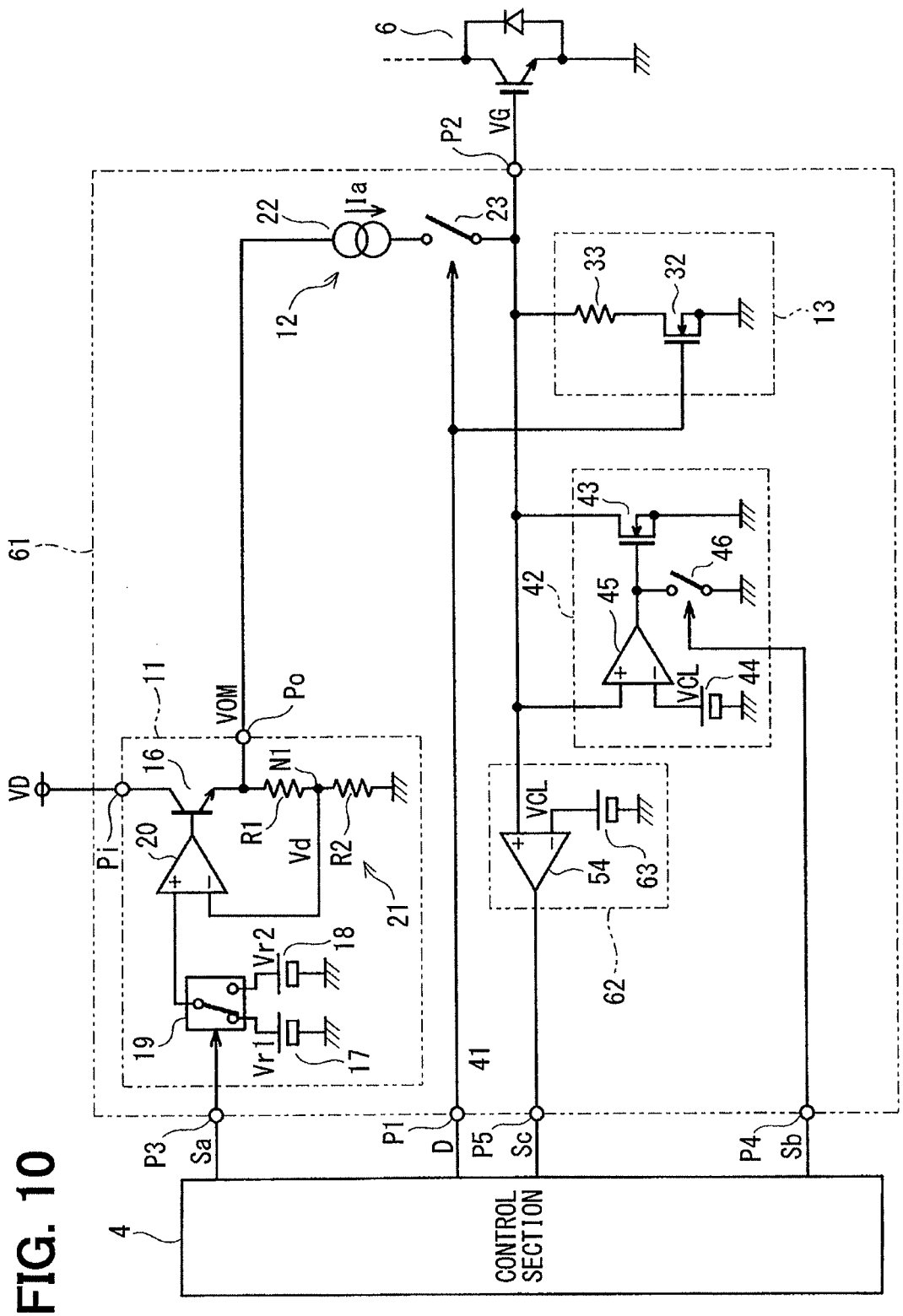
FIG. 10 is a schematic diagram of the gate drive circuit in a fourth embodiment of the present disclosure, corresponding to FIG. 2.

As shown in FIG. 10, a gate drive circuit 61 of the present embodiment has a gate voltage detection circuit 62, which is a difference from the gate voltage detection circuit 52 of the gate drive circuit 51 in the third embodiment.

The gate voltage detection circuit 62 detects the gate voltage VG of the IGBT 6, and is provided with a reference voltage generation circuit 63 and the comparator 54. The reference voltage generation circuit 63 comprises, for example, a band gap reference circuit etc., and is a voltage source which generates the limit voltage $V_{CL1}$. In this case, the voltage detection signal Sc which is an output signal of the comparator 54 is set to the L level when the gate voltage VG is less than the limit voltage $V_{CL}$, and the signal Sc is set to the H level when the gate voltage VG is equal to or higher the limit voltage $V_{CL}$. In the present embodiment, the voltage detection signal Sc at the H level is equivalent to a clamp detection signal in the claims.

Figure 11:
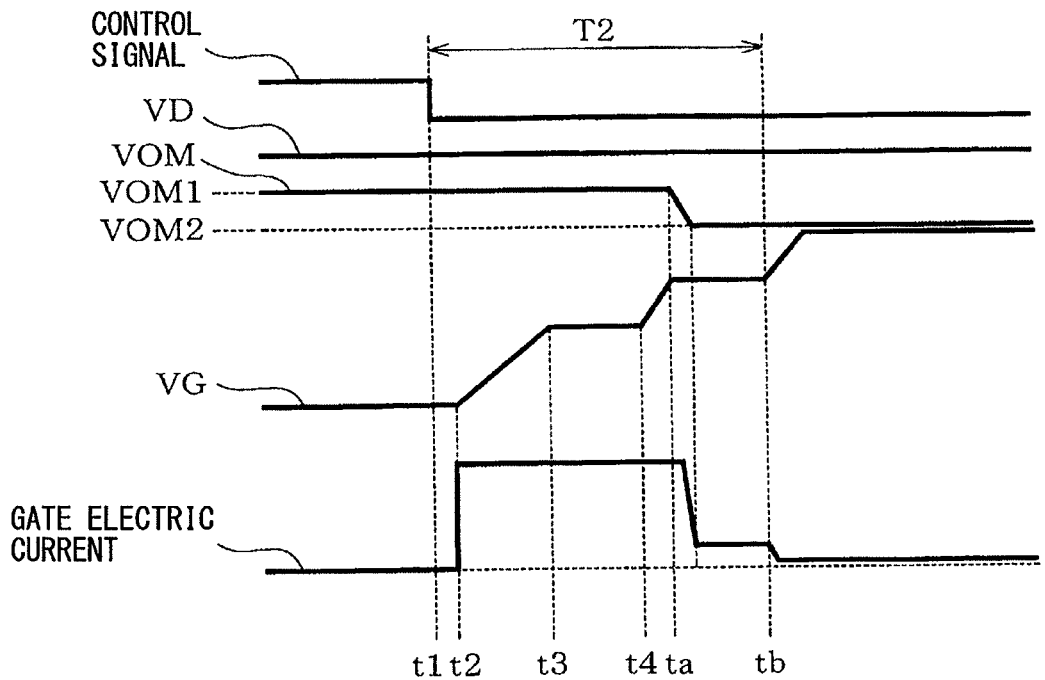
FIG. 11 is a correlation diagram of a signal, a voltage and an electric cu en in each of various parts at a turn-ON time, corresponding to FIG. 5.

Then, an operation of the gate drive circuit 61 at a time of performing a turn-ON operation of the IGBT 6 is described, with reference to FIG. 11.

When the control signal D is switched to the L level (i.e., at time t1), the switch 23 of the gate-ON drive circuit 12 is turned ON, which starts the charging of the gate capacitance and also starts the rise of the gate voltage VG (i.e., at time t2).

Further, at time t1 or before time t1, the control section 4 sets both of the voltage switch signal Sa and the clamp signal Sb to the H level. Thereby, the power supply circuit 11 is switched to a state of outputting the drive voltage $V_{OM}$ being set to the first set value $V_{OM1}$. Further, the clamp circuit 42 is in a state in which it is capable of performing a clamp operation. The control section 4 starts the measurement of the second setup time T2 at time t1, which is an inversion timing of the control signal D.

When the gate voltage VG rises to the threshold voltage of the IGBT 6, the IGBT 6 is turned ON. Then, at time ta when the gate voltage VG rises to the limit voltage $V_{CL}$ after the mirror period (i.e., time t3-t4), the gate voltage VG is kept at (i.e., restricted to) the limit voltage $V_{CL}$ by the clamp operation of the clamp circuit 42. At this point (i.e., at time ta), the voltage detection signal Sc is switched from the L level to the H level. Then, if the control section 4 detects that the voltage detection signal Sc is switched to the H level, the control section 4 sets the voltage switch signal Sa to the L level. Thereby, the power supply circuit 11 is switched to a state of outputting the drive voltage VON' being set to the second set value $V_{OM2}$.

Further, after the lapse of the second setup time T2 from time t1 (i.e., at time tb), the control section 4 sets the clamp signal Sb to the L level. Thereby, the clamp operation by the clamp circuit 42 is stopped. Therefore, the gate voltage VG rises up to the second set value $V_{OM2}$, and causes the turn-ON operation of the IGBT 6 in a saturation region.

According to the present embodiment, while the same effects and the benefits as the other embodiments are provided as described above, the following advantages are also achieved. That is, in the present embodiment, the switching of the drive voltage $V_{OM}$ is performed when the detection value of the gate voltage detection circuit 62 reaches the limit voltage $V_{CL}$ i.e., at a time when the mirror period ends and the clamp operation by the clamp circuit 42 is started. Therefore, while a detailed timing design is dispensed with, the drive voltage $V_{OM}$ is securely switched to a relatively-low second set value $V_{OM2}$, immediately before the IGBT 6 is turned ON to the Full-ON state, regardless of the variations of the mirror period.

(Fifth Embodiment)

Hereafter, the fifth embodiment of the present disclosure is described with reference to FIGS. 12 and 13.

Figure 12:
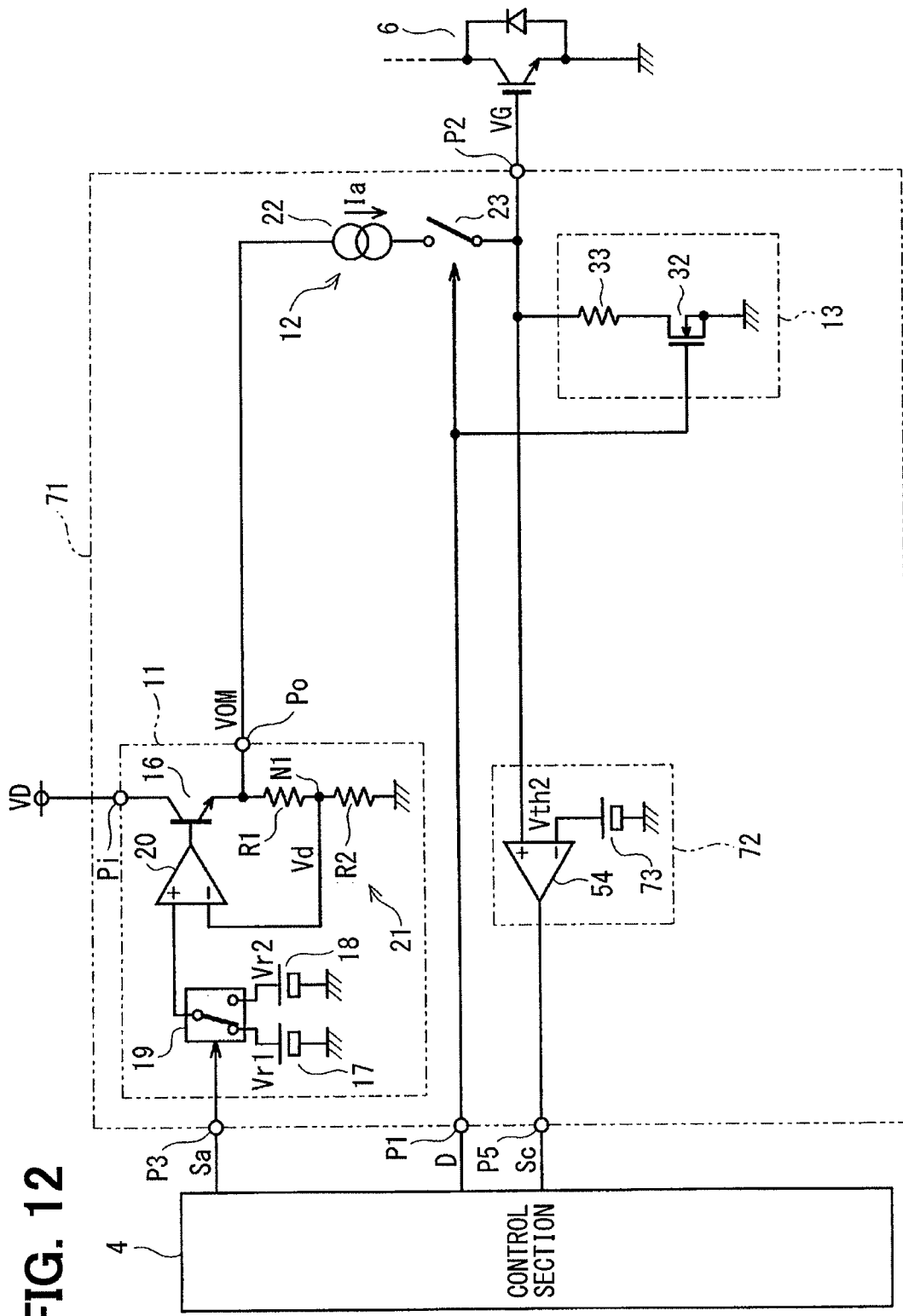
FIG. 12 is a schematic diagram of the gate drive circuit in a fifth embodiment of the present disclosure, corresponding to FIG. 2.

As shown in FIG. 12, a gate drive circuit 71 of the present embodiment is provided with a gate voltage detection circuit 72, which is a difference from the gate drive circuit 7 of the first embodiment.

The gate voltage detection circuit 72 detects the gate voltage VG of the IGBT 6, and is provided with a reference voltage generation circuit 73 and the comparator 54. The reference voltage generation circuit 73 comprises, for example, a band gap reference circuit etc., and is a voltage source which generates a voltage Vth2, i.e., a second determination threshold value Vth2.

The second determination threshold value Vth2 is set as a value that is higher than the mirror voltage of the IGBT 6 and is lower than the second set value $V_{OM2}$. In this case, the voltage detection signal Sc which is an output signal of the comparator 54 is set to the L level when the gate voltage VG is less than second determination threshold value Vth2, and the signals Sc is set to the H level when the gate voltage VG is equal to or higher than the second determination threshold value Vth2.

Figure 13:
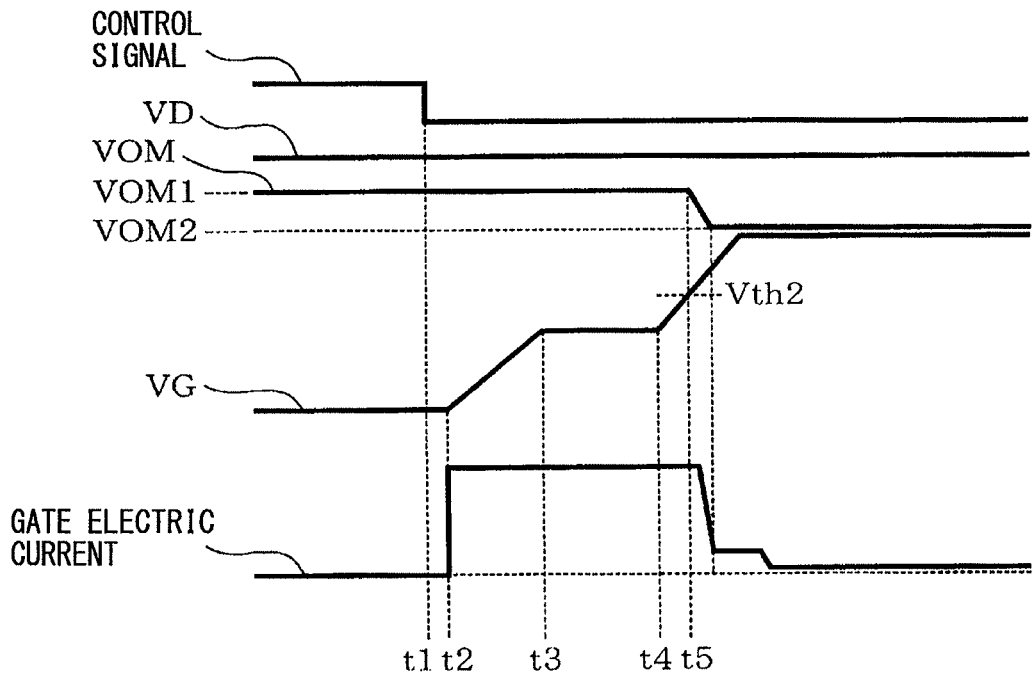
FIG. 13 is a correlation diagram of a signal, a voltage and an electric current in each of various parts at a turn-ON time, corresponding to FIG. 5.

Then, an operation of the gate drive circuit 71 at a time of performing a turn-ON of the IGBT 6 is described, with reference to FIG. 13.

When the control signal D is switched to the L level (i.e., at time t1), the switch 23 of the gate-ON drive circuit 12 is turned ON, which starts the charging of the gate capacitance and also starts the rise of the gate voltage VG (i.e., at time t2). Further, at time t1 or before time t1, the control section 4 sets the voltage switch signal Sa to the H level. Thereby, the power supply circuit 11 is switched to a state of outputting the drive voltage $V_{OM}$ being set to the first set value $V_{OM}$.

When the gate voltage VG rises to the threshold voltage of the IGBT 6, the IGBT 6 is turned ON. Then, at a time when the gate voltage VG rises to the second determination threshold value Vth2 that is higher than the mirror voltage Vm after the mirror period (i.e., time t3-t4), the voltage detection signal Sc is switched from the L level to the H level (i.e., at time t5). Then, if the control section 4 detects that the voltage detection signal Sc is switched to the H level, the control section 4 sets the voltage switch signal Sa to the L level, Thereby, the power supply circuit 11 is switched to a state of outputting the drive voltage $V_{OM}$ being set to the second set value $V_{OM2}$. Then, the gate voltage VG rises up to the second set value $V_{OM2}$, and causes the turn-ON operation of the IGBT 6 in a saturation region.

According to the present embodiment, while the same effects and benefits as each of the above-mentioned embodiments are provided, the following advantages are also achieved. That is, in the present embodiment, the switching of the drive voltage $V_{OM}$ is performed when the detection value of the gate voltage detection circuit 72 reaches the second determination threshold value Vth2 that is higher than the mirror voltage Vm and is lower than the second set value $V_{OM2}$. Therefore, while a detailed timing design is dispensed with, the drive voltage $V_{OM}$ is securely switched to a relatively-low second set value $V_{OM2}$ at a timing immediately before the IGBT 6 is turned ON to the Full-ON state, regardless of the variation of the mirror period.

(Sixth Embodiment)

Hereafter, the sixth embodiment of the present disclosure is described with reference to FIGS. 14 and 15.

Figure 14:
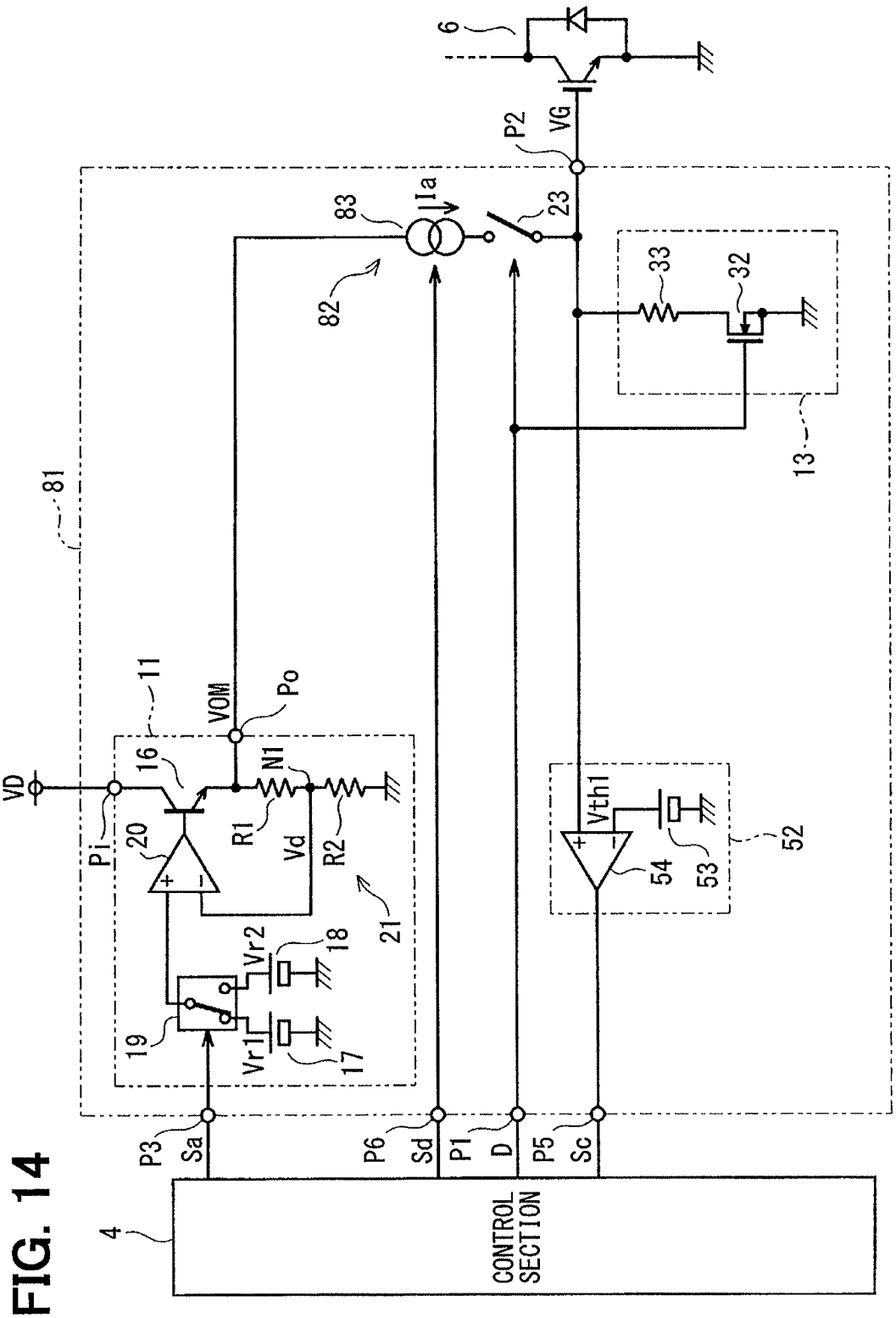
FIG. 14 is a schematic diagram of the gate drive circuit in a sixth embodiment of the present disclosure, corresponding to FIG. 2.

As shown in FIG. 14, a gate drive circuit 81 of the present embodiment is provided with the gate voltage detection circuit 52 shown in FIG. 8 and with a gate-ON drive circuit 82 that replaces the gate-ON drive circuit 12, which are differences from the gate drive circuit 7 of the first embodiment.

The gate-ON drive circuit 82 is provided with an electric current output circuit 83 and the switch 23. The gate-ON drive circuit 82 is equivalent to a current regulator circuit in the claims. Although the electric current output circuit 83 outputs the constant electric current Ia similarly to the electric current output circuit 22, it is provided with a function that varies a value of such electric current. The electric current output circuit 83 sets a value of the electric current Ia to the same value as the one from the electric current output circuit 22, when an electric current switching signal Sd provided via a terminal P6 from the control section 4 is at the L level. The electric current output circuit 83 sets the value of the electric current Ia to a value higher than the above-mentioned value, when the electric current switching signal Sd is at the H level.

According to the present embodiment, the following effects and benefits are achieved.

Figure 15:
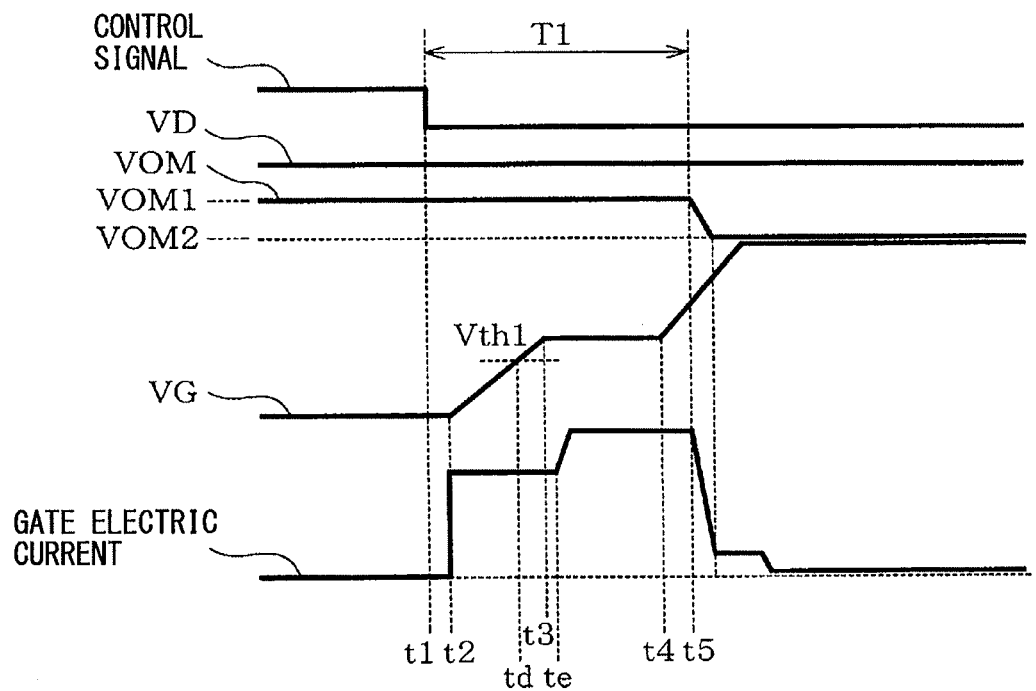
FIG. 15 is a correlation diagram of a signal, a voltage and an electric current in each of various parts at a turn-ON time, corresponding to FIG. 5.

As shown in FIG. 15, the operation at the time of turn-ON of the gate drive circuit 81 of the present embodiment is generally the same as that of the gate drive circuit 7 of the first embodiment. However, the operation of the gate drive circuit 81 differs in the following points from the operation of the gate drive circuit 7. That is, the control section 4 sets the electric current switching signal Sd to the H level at time te, which is a predetermined time from time td, at which the gate voltage VG reaches the first determination threshold value Vth1 that is lower than the mirror voltage Vm, causing the voltage detection signal Sc switched from the L level to the H level. Thereby, the current value of the constant electric current Ia outputted from the electric current output circuit 83 increases.

According to such configuration, while the same effects and benefits as each of the above-mentioned embodiments are achieved, the following advantages are also achieved. That is, the length of a period between the turn-ON start time and the mirror period end time is shortened by performing the constant electric current drive of the gate, because of a decrease of the turn-ON period. The shortening effect of the turn-ON period is achieved much more noticeable as a value of the constant electric current increases. In the present embodiment, since the electric current Ia outputted from the electric current output circuit 83 is increased by setting the switch timing in the above-described manner, the turn-ON period is further shortened, and, as a result, the switching loss is further reduced.

(Seventh Embodiment)

In the third and fifth embodiments, the switch timing of the drive voltage $V_{OM}$ is determined based on the detection value of the gate voltage VG. However, the switch timing for switching the drive voltage $V_{OM}$ may be determined based on other voltage detection value other than the detection value of the gate voltage VG.

Figure 16:
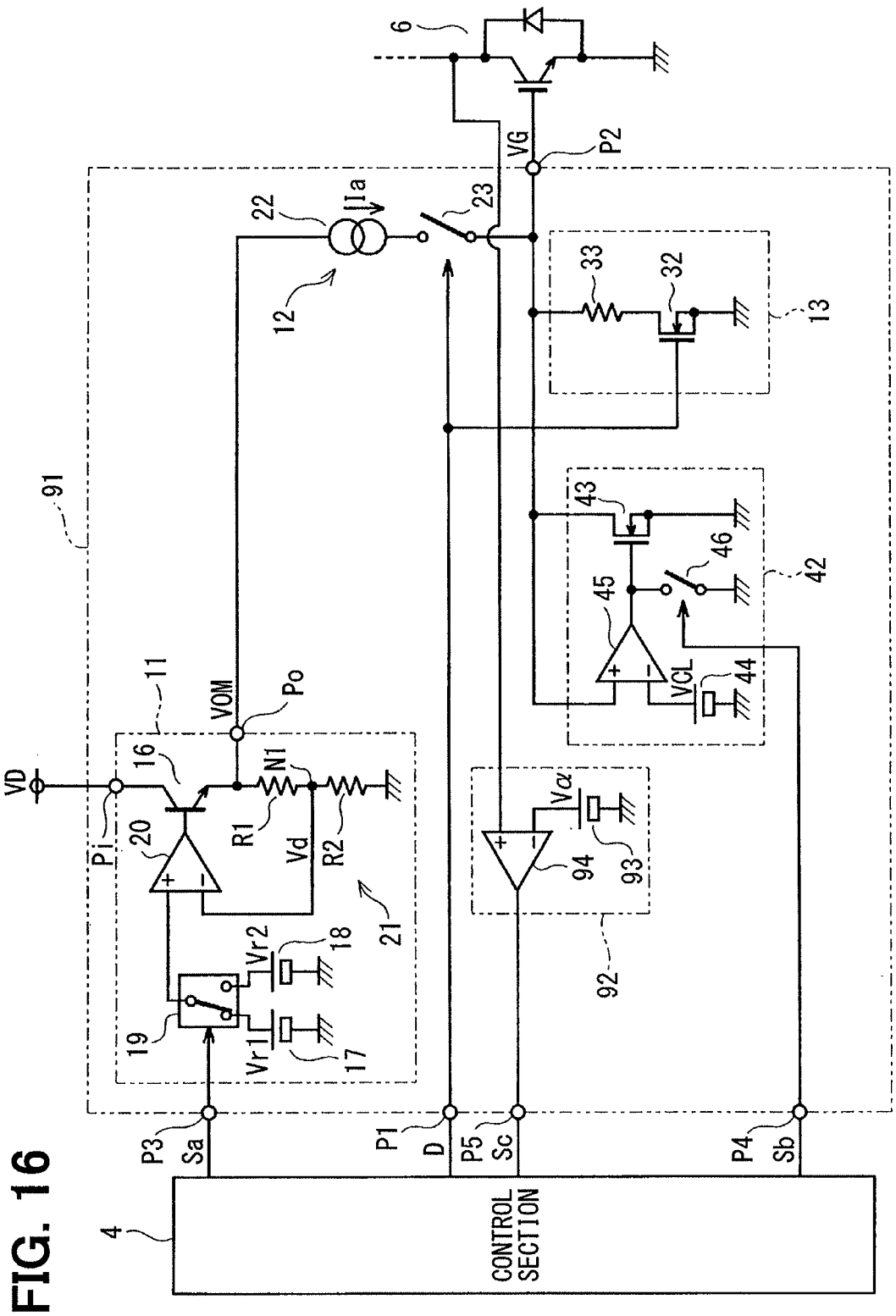
FIG. 16 is a schematic diagram of the gate drive circuit in a seventh embodiment of the present disclosure, corresponding to FIG. 2.

For example, based on the detection value of a collector-emitter voltage Vce of the IGBT 6, the switch timing of the drive voltage $V_{OM}$ may be determined by a gate drive circuit 91 shown in FIG. 16.

The gate drive circuit 91 has a collector voltage detector 92 added to the gate drive circuit 41 in FIG. 6. The collector voltage detector 92 is provided with a reference voltage generation circuit 93 and a comparator 94. The reference voltage generation circuit 93 is a voltage source which generates a determination voltage Vα with reference to the ground (i.e., with reference to an emitter of the IGBT 6). In this case, the determination voltage Vα is a value that fulfills the following conditions, i.e., (i) when the gate voltage VG is less than the first determination threshold value Vth1, the voltage detection signal Sc is set to the L level, and (ii) when the gate voltage VG is equal to or higher than the first determination threshold value Vth1, the voltage detection signal Sc is set to the H level.

Figure 17:
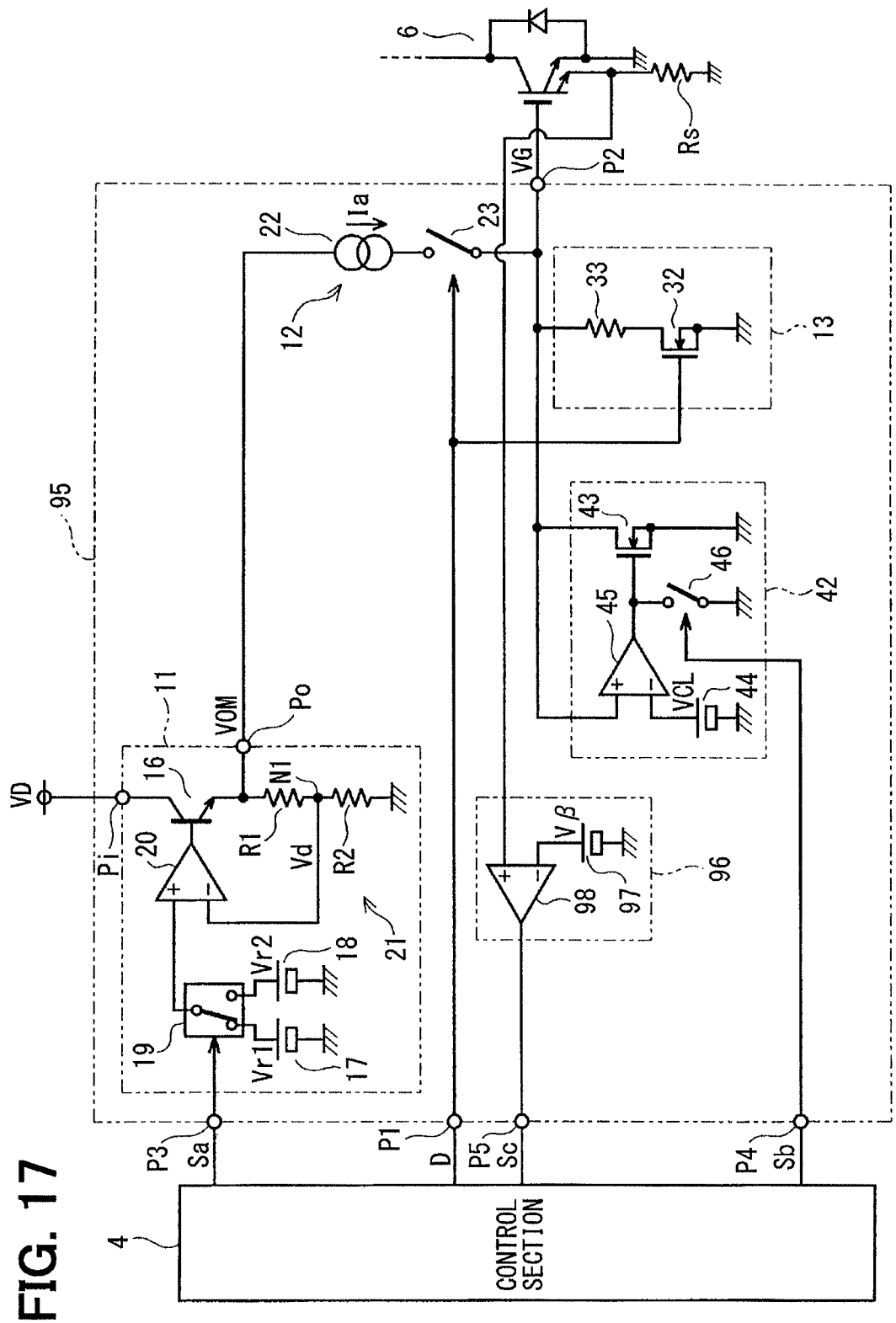
FIG. 17 is a schematic diagram of the gate drive circuit corresponding to FIG. 2.

Further, as a gate drive circuit 95 shown in FIG. 17, the switch timing of the drive voltage $V_{OM}$ may be determined based on the detection value of a terminal voltage of a shunt resistor Rs that is positioned between an emitter of the IGBT 6 and the ground, which is for the sensing of an electric current. The gate drive circuit 95 has a sense voltage detector 96 added to the gate drive circuit 41 in FIG. 6. The sense voltage detector 96 is provided with a reference voltage generation circuit 97 and a comparator 98. The reference voltage generation circuit 97 is a voltage source which generates a determination voltage vp with reference to the ground. In this case, the determination voltage VB is a value that fulfills the following conditions, i.e., (I) when the gate voltage VG is less than the first determination threshold value Vth1, the voltage detection signal Sc is set to the L level, and (ii) when the gate voltage VG is equal to or higher than the first determination threshold value Vth1, the voltage detection signal Sc is set to the H level.

(Eighth Embodiment)

Hereafter, the eighth embodiment of the present disclosure is described in which a modification of the power supply circuit (i.e., a drive voltage generation circuit in the claims) is described with reference to FIG. 18.

Although, in the first to seventh embodiments, the drive voltage $V_{OM}$ is configured to be switched either to the first set value $V_{OM1}$ or to the second set value $V_{OM2}$ by switching the reference voltage of the series regulator type power supply circuit (i.e., the power supply circuit 11) between two levels, the switching of the drive voltage may also be performed in the following manner. That is, by switching a gain of the detection voltage (i.e., a feedback voltage) in the series regulator type power supply circuit between two levels, the drive voltage $V_{OM}$ may either be switched to the first set value $V_{OM1}$ or to the second set value $V_{OM2}$.

Figure 18:
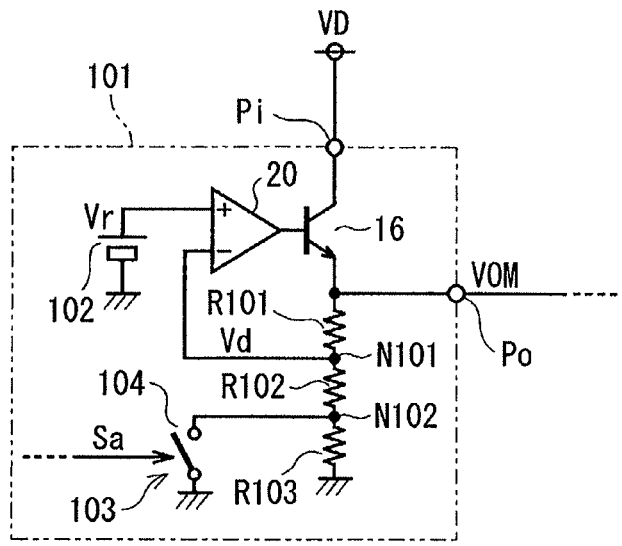
FIG. 18 is a schematic diagram of a modification example of a power supply circuit in an eighth embodiment of the present disclosure.

FIG. 18 shows a configuration of a power supply circuit 101 which has an above-mentioned modification added thereto. As shown in FIG. 18, the power supply circuit 101 is provided with the transistor 16, the OP amplifier 20, a reference voltage generation circuit 102, and a voltage detection circuit 103. The reference voltage generation circuit 102 generates a reference voltage Vr for instructing a target value of the drive voltage $V_{OM}$. The reference voltage Vr outputted from the reference voltage generation circuit 102 is provided to a non-inverted input terminal of the OP amplifier 20. The power supply circuit 101 is equivalent to a drive voltage generation circuit in the claims.

The voltage detection circuit 103 is constituted by a series circuit of resistors R101 to R103 and a switch 104. The above-mentioned series circuit is put (i.e. is connected) in between the output terminal Po and the ground. The voltage of a common node N101 between a resistor R101 and a resistor R102 is provided to an inverted input terminal of the OP amplifier 20. The switch 104 is positioned between (i) a common node N102 of the resistors R102 and R103 and (ii) the ground.

The switch 104 is switched according to a level of the voltage switch signal Sa provided by the control section 4. More specifically, the switch 104 is turned OFF when the voltage switch signal Sa is at the H level. In such manner, the detection voltage Vd, which is a division voltage by dividing the drive voltage $V_{OM}$ between (i) the resistor R101 and (ii) the in-series combination of the resistors R102, R103, is provided to the inverted input terminal of the OP amplifier 20. Further, the switch 104 is turned ON when the voltage switch signal Sa is at the L level. In such manner, the detection voltage Vd, which is a division voltage of the drive voltage $V_{OM}$ divided by the resistor R101 and the resistor R102, is provided to the inverted input terminal of the OP amplifier 20.

The resistor ratio (i.e., a division voltage ratio) of the resistors R101 to R103 is set to a value that fulfills the following conditions, i.e., (i) when the switch 104 is turned OFF and the drive voltage $V_{OM}$ has the first set value $V_{OM1}$, the detection voltage Vd is equated with the reference voltage Vr, and (ii) when the switch 104 is turned ON and the drive voltage $V_{OM}$ has the second set value $V_{OM2}$, the detection voltage Vd is equated with the reference voltage Vr.

Even when the configuration of the power supply circuit is modified in the above-described manner, the same effects and benefits as each of the above-mentioned embodiments are achieved. Further, even though one resistor and one switch are added in this modification, one voltage source which is typically a larger circuit than those parts is dispensed with. Therefore, a circuit configuration simplification effect is still achieved.

(Ninth Embodiment)

Hereafter, the ninth embodiment of the present disclosure is described in which another modification of the power supply circuit (i.e., a drive voltage generation circuit in the claims) is described with reference to FIG. 19.

In the first to seventh embodiments, the power supply circuit (i.e., the power supply circuit 11) of series regulator type has a configuration in which the power supply voltage VD is lowered regardless of whichever the voltage value of the drive voltage $V_{OM}$ is set to the first set value $V_{OM1}$ or to the second set value $V_{OM2}$. However, such a configuration may be modified in the following manner.

That is, a power supply circuit may also have a configuration in which (i) the power supply voltage VD is output "as is" when the voltage value of the drive voltage $V_{OM}$ is set to the first set value $V_{OM1}$, and (ii) the power supply voltage VD may be lowered when the voltage value of the drive voltage $V_{OM}$ is set to the second set value $V_{OM2}$.

Figure 19:
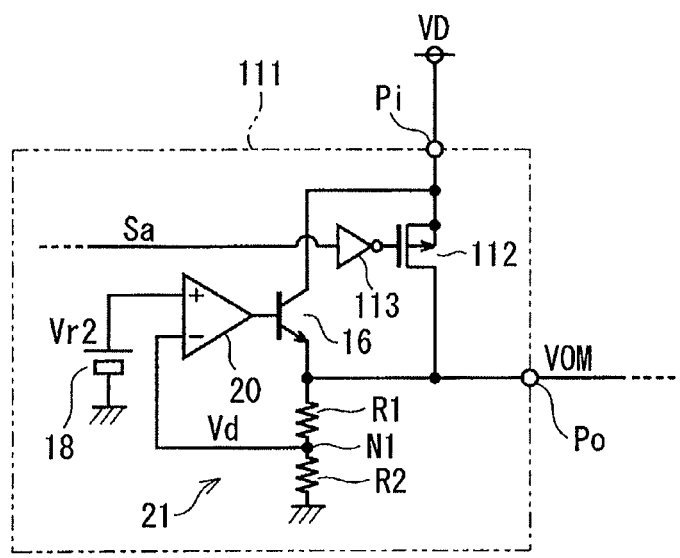
FIG. 19 is a schematic diagram of another modification example of the power supply circuit in a ninth embodiment of the present disclosure.

FIG. 19 shows a configuration of the power supply circuit 111 which has the above-mentioned modification added thereto. As shown in FIG. 19, the power supply circuit 111 is provided with the transistor 16, the reference voltage generation circuit 18, the OP amplifier 20, the voltage detection circuit 21, a P channel type MOS transistor 112, and an inverter circuit 113. In this case, the second reference voltage Vr2 outputted from the reference voltage generation circuit 18 is provided to the non-inverted input terminal of the OP amplifier 20. The power supply circuit 111 is equivalent to a drive voltage generation circuit in the claims.

The transistor 112 is positioned between the input terminal Pi and the output terminal Po. The voltage switch signal Sa is provided to the gate of transistor 112 through the inverter circuit 113. According to the above-mentioned configuration, when the voltage switch signal Sa is at the H level, the transistor 112 is turned ON and the power supply voltage VD is outputted as it is as the drive voltage $V_{OM}$.

According to the present embodiment, the voltage value (i.e., ≈ the power supply voltage VD) of the drive voltage $V_{OM}$ at such time is equivalent to the first set value ($V_{OM1}$) in the claims. Further, when the voltage switch signal Sa is at the L level, the transistor 112 is turned OFF and the drive voltage $V_{OM}$ of the second set value $V_{OM2}$ generated by lowering the voltage of the power supply voltage VD is outputted.

As described above, even if the configuration of the power supply circuit is modified, the same effects and benefits as each of the above-mentioned embodiments are achieved. Further, even though one transistor and one inverter circuit are added in this case, one voltage source which is typically a larger circuit than those parts (i.e., the transistor/inverter) is dispensed with instead. Therefore, a circuit configuration simplification effect is still achieved. Furthermore, the first set value $V_{OM}$ is substantially equal to the power supply voltage VD in this case, and it is higher than the first set value $V_{OM1}$ in each of the above-mentioned embodiments. Therefore, when the drive voltage $V_{OM}$ is set to the first set value $V_{OM1}$, the operating range of the electric current output circuit 22 is secured with a sufficient margin.

(Other Embodiments)

Although the present disclosure has been fully described in connection with the preferred embodiment thereof with reference to the accompanying drawings, it is to be noted that various changes and modifications will become apparent to those skilled in the art.

For example, as a candidate object of driving by the gate drive circuit, not only the IGBT but, for example, an MOS transistor etc. may also be employed, as long as the candidate object is a voltage drive type semiconductor device (i.e., a transistor).

The power supply circuits 11, 101, and 111 may have other circuit configuration other than the ones in FIG. 2, FIG. 18, FIG. 19, etc., as long as the configuration realizes the same function. For example, series regulator type power supply circuits 11, 101, and 111 may be replaced with switching regulator type power supply circuits. The transistor 16 may also be replaced with a PNP type transistor, a MOS transistor, or the like.

The gate-ON drive circuit 12 may have other configurations, as long as the circuit 12 is equipped with (i) the electric current output circuit 22 which outputs a constant electric current toward the gate of the IGBT 6 from the output terminal Po and (ii) a function to stop the output of the constant electric current. For example, the following modification may be made to the electric current output circuit 22 when the electric current output circuit 22 has the configuration shown in FIG. 3A. That is, while removing the switch 23, a stop function may be added to the OP amplifier 27, which stops the operation of the OP amplifier 27 according to the control signal D. Further, the OP amplifier 27 may be configured to operate when the control signal D is at the level, and may be configured to stop its operation when the control signal D is at the H level. Even with such configuration, the same operation as shown in FIG. 3A is performable.

The clamp circuit 42 may have other configurations, as long as it has the same function as the one in FIG. 6. For example, the transistor 43 may be replaced with an NPN type bipolar transistor. Further, instead of starting and stopping the clamp operation by using the switch 46, the following configurations may be employed. That is, while removing the switch 46, a stop function may be added to the OP amplifier 45, which stops the operation of the OP amplifier 45 according to the clamp signal Sb. Further, the OP amplifier 45 may be configured to operate when the clamp signal Sb is at the H level, and may be configured to stop its operation when the clamp signal Sb is at the L level. Even with such configuration, the same operation as shown in FIG. 6 is performable.

The gate-OFF drive circuit 13 may have other configurations, as long as it has the same function as the one shown in FIG. 2. For example, the transistor 32 may be replaced with a NPN type bipolar transistor.

The fourth embodiment, in which a start of the clamp operation by the clamp circuit 42 is detected by using the gate voltage detection circuit 62 having the comparator 54, may be modified to have a different configuration. For example, the clamp circuit 42 itself may have an additional function that detects a start of the clamp operation.

Such changes and modifications are to be understood as being within the scope of the present disclosure as defined by the appended claims.

What is claimed is:

1. A gate drive circuit comprising:
   a drive voltage generation circuit that outputs a drive voltage for performing an ON drive of a transistor and has a function which switches a voltage value of the drive voltage to be output in at least two levels;
   a current regulator circuit that outputs a constant electric current toward a gate terminal of the transistor from an output terminal of the drive voltage generation circuit;
   a drive control section that operates the current regulator circuit for performing a constant electric current drive of the gate of the transistor when an ON command is inputted; and
   a voltage switchover control section that sets the voltage value of the drive voltage generated by the drive voltage generation circuit to one of a first set value and a second set value that is lower than the first set value, wherein the voltage switchover control section sets the voltage value of the drive voltage to the first set value when the ON command is inputted, and the voltage switchover control section switches the voltage value of the drive voltage from the first set value to the second set value at a predetermined switch timing after an end of the mirror period of the transistor.

2. The gate drive circuit of claim 1, further comprising:

a gate voltage detection circuit that detects a gate voltage of the transistor, wherein the voltage switchover control section sets the switch timing to a point in time that is a preset time at which the detection value of the gate voltage detection circuit reaches an arbitrary voltage.

3. The gate drive circuit of claim 2, wherein the arbitrary voltage is a first determination threshold value that is lower than a mirror voltage of the transistor.

4. The gate drive circuit of claim 1, further comprising:

a clamp circuit that restricts the gate voltage of the transistor to be a limit voltage that is set to be higher than the mirror voltage of the transistor and is lower than the second set value, wherein the clamp circuit starts an operation when the ON command is inputted and continues the operation at least to the switch timing.

5. The gate drive circuit of claim 1, further comprising:

a clamp circuit that restricts the gate voltage of the transistor to be a limit voltage that is higher than the mirror voltage of the transistor and is lower than the second set value, wherein the clamp circuit outputs a clamp detection signal to the voltage switchover control section when the gate voltage reaches the limit voltage and is restricted, and the voltage switchover control section sets the switch timing to a time of receiving the clamp detection signal.

6. The gate drive circuit of claim 1, further comprising:

a gate voltage detection circuit that detects the gate voltage of the transistor, wherein the voltage switchover control section sets the switch timing to a time when the detection value of the gate voltage detection circuit reaches a second determination threshold value that is higher than the mirror voltage of the transistor and is lower than the second set value.

7. The gate drive circuit of claim 1, wherein the voltage switchover control section sets the switch timing to a point in time after a preset time from an input of the ON command.

8. The gate drive circuit of claim 1, wherein the drive voltage generation circuit is configured to
   operate when receiving a supply of a power supply voltage,
   output the power supply voltage as it is when the voltage value of the drive voltage is set to the first set value, and
   lower the power supply voltage and outputting the power supply voltage when the voltage value of the drive voltage is set to the second set value.

9. The gate drive circuit of claim 1, wherein the voltage switchover control section switches the voltage value of the drive voltage from the first set value to the second set value at the predetermined switch timing that is configured to be in a period (i) after the end of the mirror period and (ii) before having an ON resistance lowered state in which a turn-ON resistance of the transistor is sufficiently lowered.

\* \* \* \* \*